United States Patent
Hoshino et al.

(10) Patent No.: US 7,968,259 B2
(45) Date of Patent: Jun. 28, 2011

(54) SEMICONDUCTOR DEVICE, METHOD FOR MANUFACTURING SEMICONDUCTOR DEVICE, AND COMPUTER READABLE MEDIUM

(75) Inventors: Hiromi Hoshino, Kawasaki (JP); Takashi Maruyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 191 days.

(21) Appl. No.: 12/326,154

(22) Filed: Dec. 2, 2008

(65) Prior Publication Data

US 2009/0162760 A1 Jun. 25, 2009

(30) Foreign Application Priority Data

Dec. 20, 2007 (JP) ................. 2007-328813

(51) Int. Cl.
*G03F 9/00* (2006.01)
*G03C 5/00* (2006.01)

(52) U.S. Cl. ............. 430/30; 430/296; 430/942; 716/54

(58) Field of Classification Search ............. 430/30, 430/296, 942; 716/19, 21, 54
See application file for complete search history.

(56) References Cited

U.S. PATENT DOCUMENTS 6,560,768 B2 * 5/2003 Inanami et al. .................. 716/21

FOREIGN PATENT DOCUMENTS

| JP | 8-316131 | 11/1996 |
|----|----------|---------|
| JP | 2000-269126 | 9/2000 |
| JP | 2001-93799 | 4/2001 |
| JP | 2003-332205 | 11/2003 |
| JP | 2005-101405 | 4/2005 |

* cited by examiner

*Primary Examiner* — Christopher G Young
(74) *Attorney, Agent, or Firm* — Staas & Halsey LLP

(57) ABSTRACT

In a multi-project-chip semiconductor device, semiconductor elements fabricated on a wafer have a layout that corresponds to an exposure order of a pattern of the semiconductor elements and that is based on information indicating manufacture conditions and the number of shots and are arranged such that the semiconductor elements having the same manufacture condition are adjacent to each other in ascending or descending order of the number of shots.

18 Claims, 23 Drawing Sheets exposure system 20

| user name | chip identification number | chip size | manufacture condition (=individual action items) | | | | | | | shots number |
|---|---|---|---|---|---|---|---|---|---|---|
| | | | item a | item b | item c | item d | item e | item f | item g | |
| A | 1 | X11 Y11 X12 Y12 | 1 | 1 | 1 | 0 | 1 | 0 | 1 | 32197 |
| A | 2 | X21 Y21 X22 Y22 | 0 | 1 | 0 | 0 | 0 | 1 | 0 | 805 |
| B | 3 | X31 Y31 X32 Y32 | 0 | 1 | 0 | 0 | 0 | 1 | 0 | 261 |
| C | 4 | X41 Y41 X42 Y42 | 1 | 0 | 1 | 1 | 1 | 1 | 0 | 7055 |
| J | m | Xm1 Ym1 Xm2 Ym2 | 1 | 1 | 1 | 0 | 1 | 0 | 1 | 96082 |
| K | m+1 | X(m+1)1 Y(m+1)1 X(m+1)2 Y(m+1)2 | 0 | 0 | 0 | 0 | 0 | 1 | 0 | 15690 |
| W | n-1 | X(n-1)1 Y(n-1)1 X(n-1)2 Y(n-1)2 | 1 | 1 | 1 | 1 | 1 | 1 | 0 | 7064 |
| W | n | Xn1 Yn1 Xn2 Yn2 | 1 | 1 | 1 | 0 | 1 | 0 | 1 | 1557 |

FIG. 9

| | | | manufacture condition (=individual action items) | | | | | | | | |
|---|---|---|---|---|---|---|---|---|---|---|---|
| | user name | chip identification number | layout area coordinate | item a | item b | item c | item d | item e | item f | item g | shots number |
| 1 | J | m | xm(min) ym(min) xm(max) ym(max) | 1 | 1 | 1 | 0 | 1 | 0 | 1 | 96082 |
| 2 | A | 1 | x1min y1min,x1max y1max | 1 | 1 | 1 | 0 | 1 | 0 | 1 | 32197 |
| 3 | W | n | xn(min) yn(min) xn(max) yn(max) | 1 | 1 | 1 | 0 | 1 | 0 | 1 | 1557 |
| 4 | W | n-1 | x(n-1)min,y(n-1)min x(n-1)max,y(n-1)max | 1 | 0 | 1 | 1 | 1 | 1 | 0 | 7064 |
| | C | 4 | x4min y4min x4max y4max | 1 | 0 | 1 | 1 | 1 | 1 | 0 | 7055 |
| | H | m+1 | x(m+1)min,y(m+1)min x(m+1)max,y(m+1)max | 0 | 1 | 0 | 0 | 0 | 1 | 0 | 15690 |
| | A | 2 | x2min y2max x2max | 0 | 1 | 0 | 0 | 0 | 1 | 0 | 805 |
| n | B | 3 | x3min y3min x3max y3max | 0 | 1 | 0 | 0 | 0 | 1 | 0 | 261 |

31

31

31    32

31

31    32 sub-field sub-field

FIG. 27
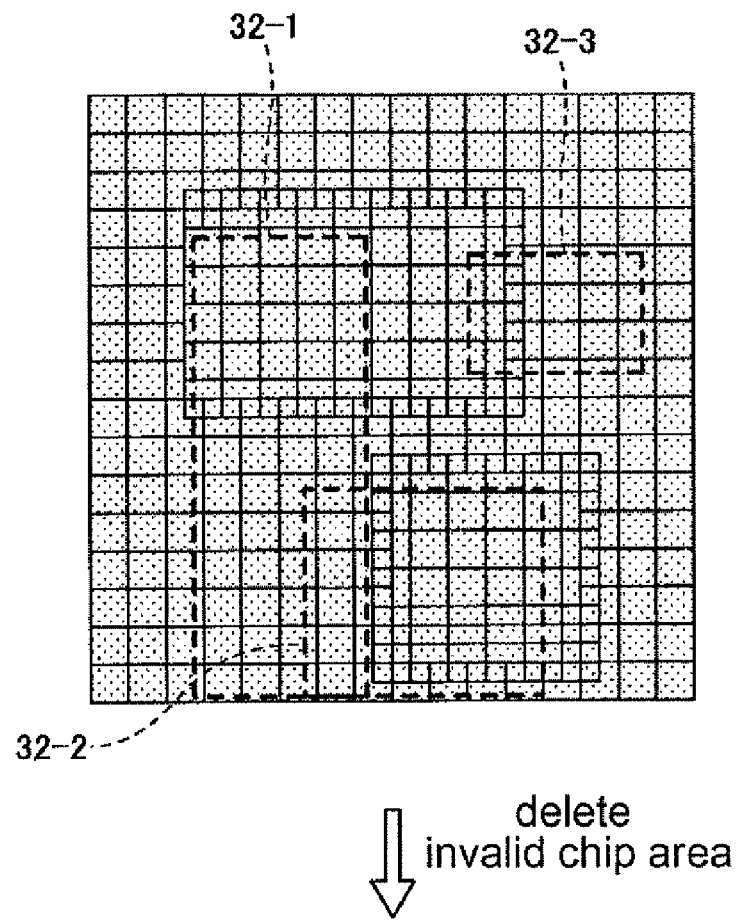
delete invalid chip area
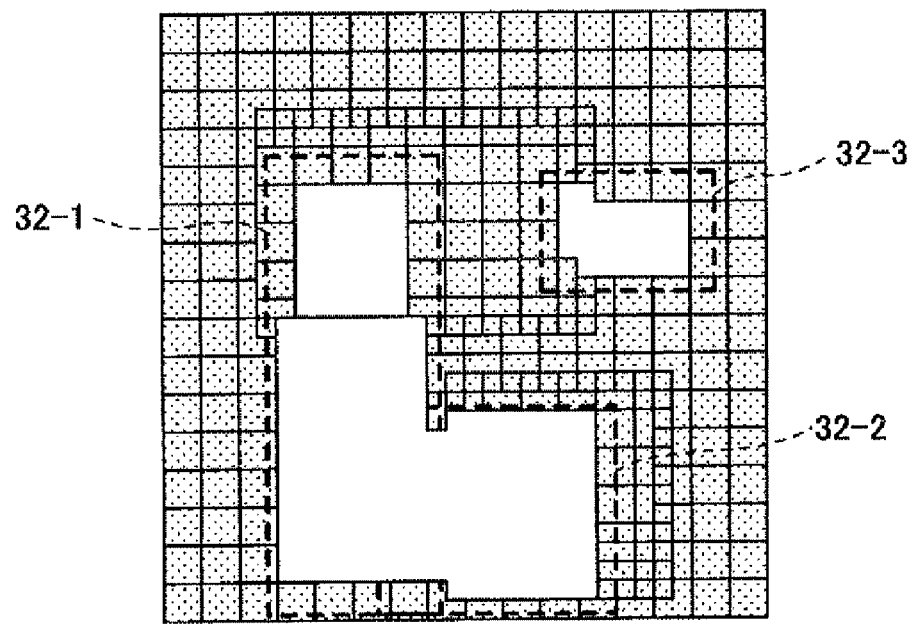

FIG. 28
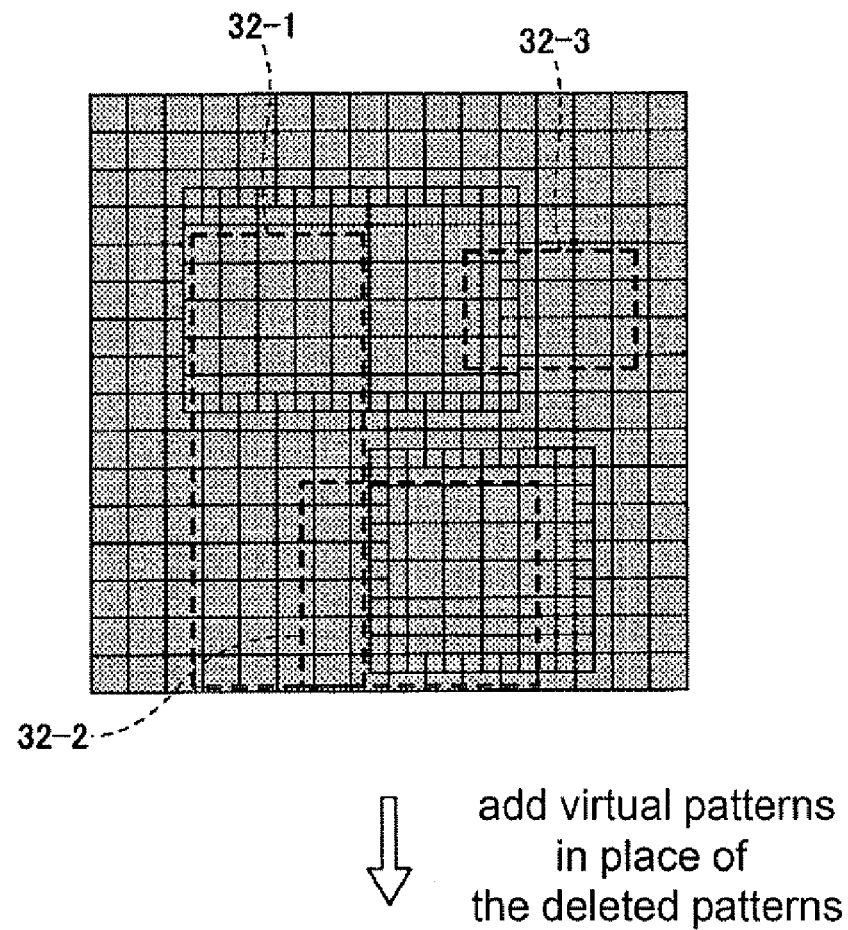
add virtual patterns
in place of
the deleted patterns
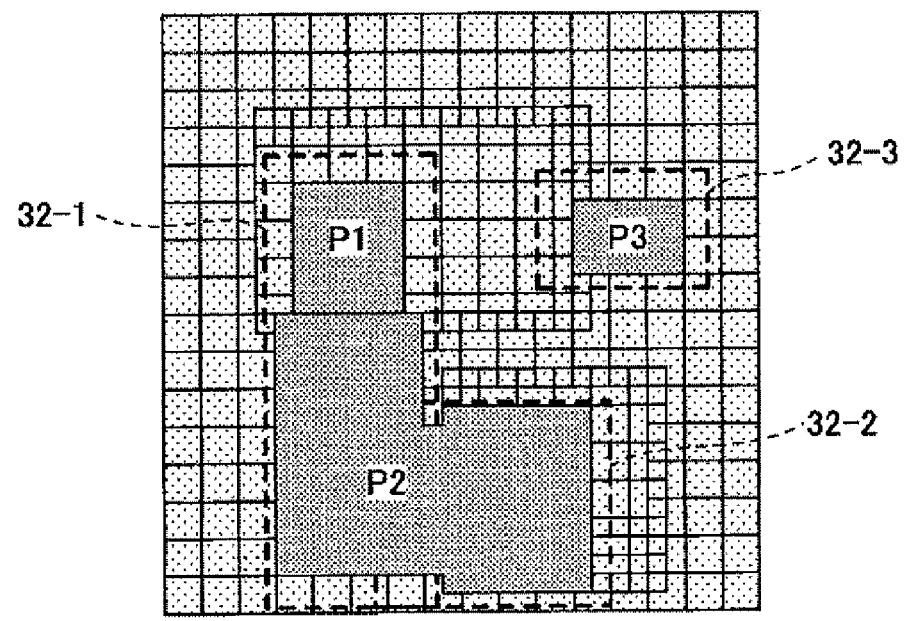

SEMICONDUCTOR DEVICE, METHOD FOR MANUFACTURING SEMICONDUCTOR DEVICE, AND COMPUTER READABLE MEDIUM

CROSS REFERENCE TO RELATED APPLICATION

This application is based upon and claims the benefit of priority from the prior Japanese Patent Application NO. 2007-328813 filed on Dec. 20, 2007, the entire contents of which are incorporated herein by reference.

BACKGROUND

1. Field

The embodiments discussed herein are directed to semiconductor device, a method for manufacturing a semiconductor device by using exposure processing using a direct writing technology, and a computer-readable medium for causing a computer to execute a method for manufacturing such a semiconductor device.

2. Description of the Related Art

For a semiconductor device based on a multi-project-chip semiconductor elements (or semiconductor chips) of multiple users or multiple specifications/types are fabricated in divided areas on the wafer. The wafer on which the semiconductor elements are fabricated is subjected to various tests and so on directly or after being diced into individual semiconductor elements. Semiconductor elements manufactured in such a manner are called "multi-project-chip semiconductor elements" or "multi-project chips". Since such multi-project-chip semiconductor elements are manufactured with semiconductor elements of different users or different specifications/types being placed on the same wafer, and thus are suitable for, for example, a case in which a small number of prototypes are manufactured at relative low cost before semiconductor elements are mass-produced.

The improvements of an electron-beam exposure throughput are discussed on manufacturing such multi-project-chip device. For example, Japanese Laid-open Patent Publication No. 8-316131 discloses an electron-beam lithography in which waiting time until an electron beam in one column is stabilized is varied in accordance with the density of a written pattern. For example, Japanese Laid-open Patent Publication No. 2000-269126 discloses an exposure method for suppressing a throughput reduction during dummy-pattern exposure. For example, Japanese Laid-open Patent Publication No. 2001-93799 discloses a writing method for improving, during writing of different chip patterns onto a single wafer, a throughput from when writing data is stored in a buffer memory until the wafer is exposed to an electron beam. For example, Japanese Laid-open Patent Publication No. 2003-332205 discloses an electron-beam exposure method for improving a throughput by eliminating unevenness in flatness in chemical-mechanical polishing, the unevenness resulting from a difference in pattern-area densities. For example, Japanese Laid-open Patent Publication No. 2005-101405 discloses an exposure method for reducing uneven pattern-area densities by providing dummy patterns according to the lowest pattern-area density.

SUMMARY

According to one aspect of the present embodiments, a method for manufacturing a multi-project-chip semiconductor includes: arranging a plurality of semiconductor elements to be fabricated on a wafer such that the semiconductor elements having the same manufacture condition are adjacent to each other in ascending or descending order of the number of shots, by determining, using a computer, a layout of the plurality of semiconductor elements in accordance with an exposure order of a pattern of the plurality of semiconductor elements and on the basis of information indicating manufacture conditions and the number of shots; and performing exposure, using an exposure apparatus using a direct writing technology, on the plurality of semiconductor elements in accordance with the exposure order.

BRIEF DESCRIPTION OF THE DRAWINGS

FIG. 8 illustrates one example of a chip management table;

FIG. 9 illustrates the chip management table after sorting is performed;

FIG. 27 illustrates pattern deletion performed in pattern editing processing;

FIG. 28 illustrates replacement of patterns with virtual patterns, the replacement being performed in the pattern editing processing;

DESCRIPTION OF THE PREFERRED EMBODIMENTS

Figure 1:
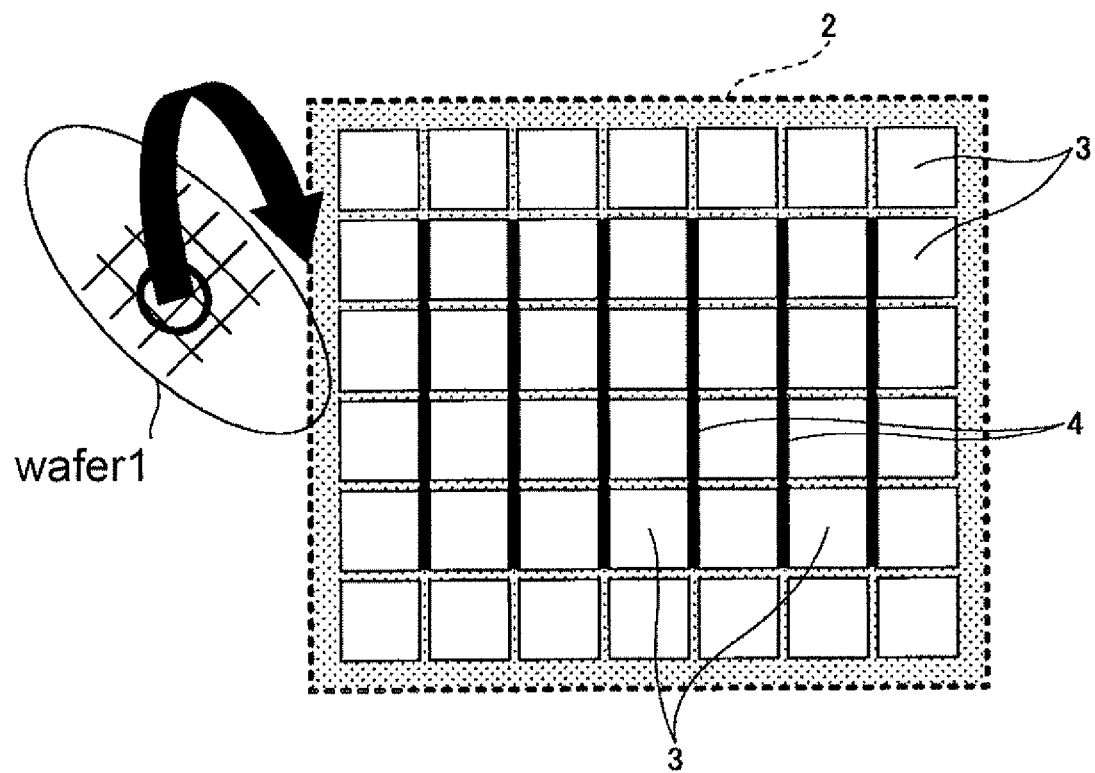
FIG. 1 sows one example of a multi-project-chip semiconductor device.

FIG. 1 shows one example of a multi-project-chip semiconductor device. At the right side in FIG. 1, an area 2 of exposure data for one file on a wafer 1 is enlarged and surrounded by dotted lines. Each rectangular area 3 indicates the area of one semiconductor element to be fabricated, and scribe patterns 4 indicate areas for verifying position displacement of the semiconductor elements, the pitch of the semiconductor elements, and so on. The multi-project-chip system, however, does not allow for fabrication of a large number of the same semiconductor elements and is not suitable for mass production. Thus, the multi-project-chip system is generally used to manufacture engineering samples (ESs) at a pre-production stage of semiconductor elements or to conduct testing, such as macro verification and chip verification, on a wafer.

Direct writing, such as electron-beam exposure that does not use a reticle, may be used as lithography for the multi-project-chip system, but is significantly low in the throughput compared to photolithography. Thus, the multi-project-chip semiconductor elements may not be able to satisfy a condition for a short delivery period, although a required number of elements is small compared to mass-produced products.

On the other hand, although the required number of individual elements is small, the multi-project-chip semiconductor device is an assembly of semiconductor elements of, for example, various users, and thus requires individual actions to respond to user-specific requests. This leads to an increase in the number of combinations of manufacture conditions that are specific to the semiconductor elements, thus making it impossible to reduce to the number of lots (i.e., the total number of wafers) to less than the number of types of manufacture conditions for the semiconductor elements. Accordingly, the exposure time increases and the throughput is thus prone to decrease. Examples of items for the individual actions include tuning, chip characteristics (including a power-supply voltage and the presence/absence of oxidation), a wiring structure, chip sizes, the presence/absence of bumps, and the thickness of a wafer for shipment.

A large number of types of manufacture conditions for each semiconductor element (i.e., a large number of lots) means that the multi-project-chip semiconductor elements on the wafer which are fabricated with predetermined manufacture conditions include both valid semiconductor elements that require the predetermined conditions and that are ultimately shipped as products and invalid semiconductor elements that do not require the predetermined conditions and that are not ultimately shipped as products.

Figure 2:
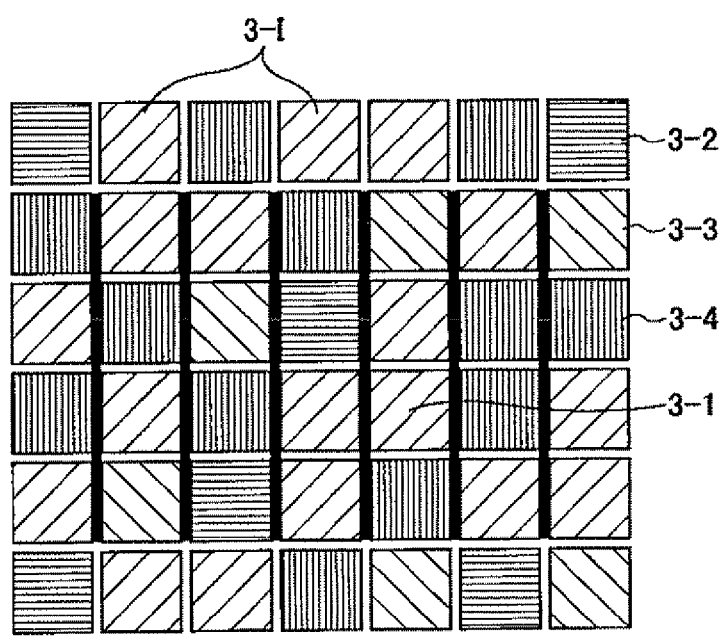
FIG. 2 shows semiconductor elements fabricated in a predetermined area on a wafer.
Figure 3:
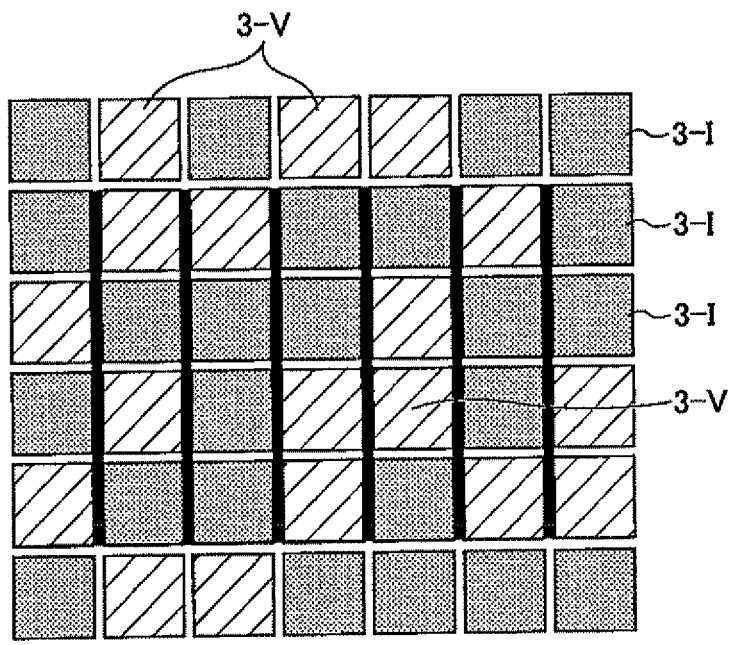
FIG. 3 shows valid semiconductor elements and invalid semiconductor elements on the wafer shown in FIG. 2.

FIG. 2 shows semiconductor elements fabricated in a predetermined area on a wafer. Semiconductor elements 3-1 to 3-4 are fabricated with manufacture conditions that are different from each other. In FIG. 3, of the semiconductor elements 3-1 to 3-4 fabricated as shown in FIG. 2, valid semiconductor elements are denoted by 3-V and invalid semiconductor elements are denoted by 3-I. The semiconductor elements 3-1 shown in FIG. 2 provide the valid semiconductor elements 3-V in FIG. 3.

Figure 4:
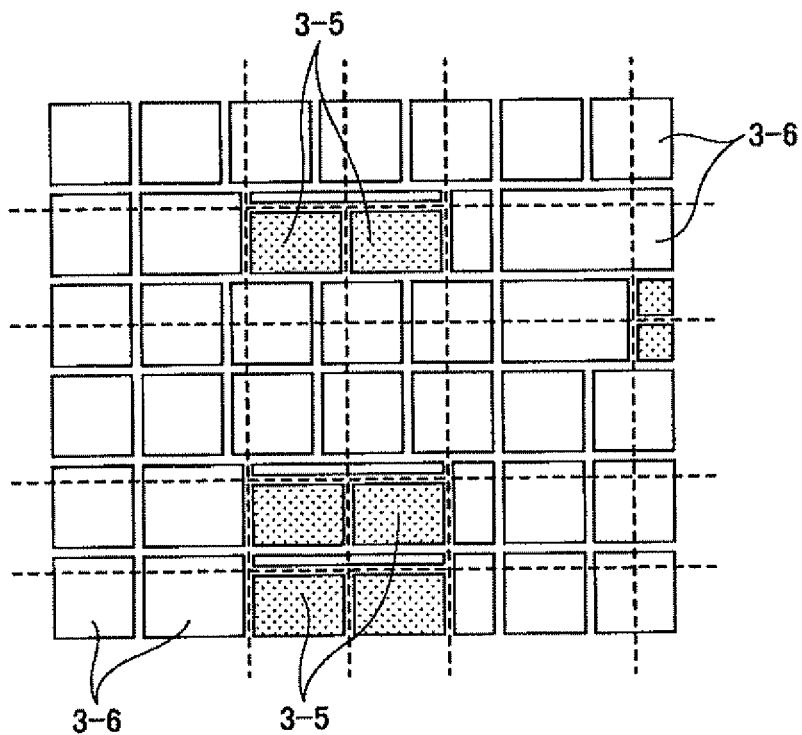
FIG. 4 shows semiconductor elements fabricated in a predetermined area on a wafer.
Figure 5:
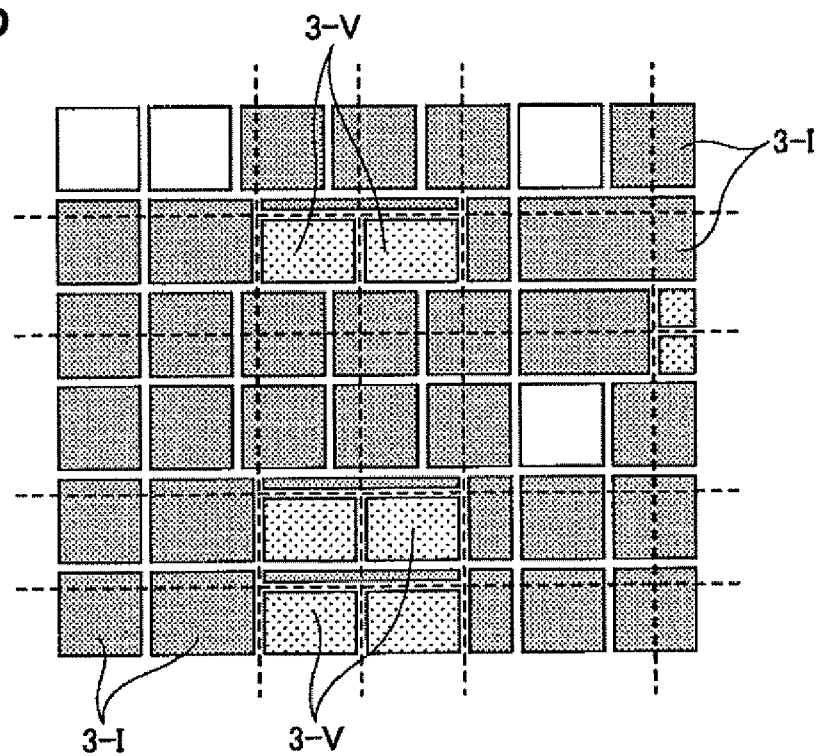
FIG. 5 shows valid semiconductor elements and invalid semiconductor elements on the wafer shown in FIG. 4.

FIG. 4 shows semiconductor elements to be fabricated in a predetermined area on a wafer. Reference numerals 3-5 and 3-6 denote semiconductor elements fabricated with manufacture conditions that are different from each other. In FIG. 4, the dotted lines indicate scribe lines. The semiconductor elements 3-5 have different chips sizes from other semiconductor elements 3-6 and have requirements for which different actions are to be taken. In FIG. 5, of the semiconductor elements 3-5 and 3-6 fabricated as shown in FIG. 4, valid semiconductor elements are denoted by 3-V and invalid semiconductor elements are denoted by 3-I. In the case of FIG. 5, the semiconductor elements 3-5 shown in FIG. 4 provide the valid semiconductor elements 3-V and the semiconductor elements 3-6 on the scribe lines provide the invalid semiconductor elements 3-I.

With a multi-project-chip semiconductor device, as described above in conjunction with FIGS. 3 and 5, the semiconductor elements in the semiconductor device include valid semiconductor elements and invalid semiconductor elements for each lot. With exposure data used in the known technologies, an exposure apparatus faithfully writes a pattern on all semiconductor elements without distinguishing between valid semiconductor elements and invalid semiconductor elements. However, the invalid semiconductor elements do not need to be completed as semiconductor elements, and this means that useless exposure is performed on a portion of the invalid semiconductor elements.

In the present invention, exposure data for a layout of semiconductor elements in a multi-project-chip semiconductor device (the semiconductor elements will hereinafter may be referred to as "semiconductor chips" or "multi-project chips") is created so as to be an effective pattern for improving an exposure throughput using a direct writing technology.

When a direct writing technology such as electron-beam exposure is used, an increase in the wafer moving speed leads to an improvement in the throughput. For example, the wafer moving speed of a vector-scan electron-beam exposure apparatus depends on the beam-deflection time and the radiation time of an electron beam. That is, the wafer moving speed depends on the density of an exposure pattern. Thus, the exposure apparatus controls the moving speed of the wafer stage so that, when the pattern density is high, the wafer moves slowly since a large amount of time is required for the exposure, and when the pattern density is low, the wafer moves fast since a small amount of time is required for the exposure. During the movement of the wafer stage, when the acceleration and deacceleration occur frequently, the wafer stage may slow down before reaching its intended moveable maximum speed or the wafer stage may come to a stop due to failure of deacceleration to a set speed. This leads to a decrease in the exposure throughput. Thus, in order to improve the exposure throughput, it is desired that the moving speed of the wafer stage be as constant as possible or the frequency of the acceleration/deacceleration be low and the acceleration/deacceleration range be small. Accordingly, in the present invention, a layout of semiconductor chips (or multi-project chips) in a multi-project-chip semiconductor device is determined considering the density of an exposure pattern.

During creation of exposure data for such a multi-project-chip semiconductor device, it is not necessary to write a pattern as faithfully as for manufacturing valid chips that need to be completed as chips and thus it is possible to omit the writing to the extent that the manufacture of the valid chips is not affected. Omission of the writing leads to a decrease in the exposure time. Accordingly, in the present embodiment, for example, valid chips and invalid chips are distinguished according to respective lot processing conditions and exposure data for the multi-project chips is edited so that, for example, optimum exposure patterns are arranged for the valid chips and the invalid chips, respectively.

As described above, considering features of the multi-project chips, exposure data is created so as to improve the throughput of exposure using a direct writing technology, such as electron-beam exposure or laser-beam exposure, and to provide an optimum exposure throughput.

First Embodiment

Figure 6:
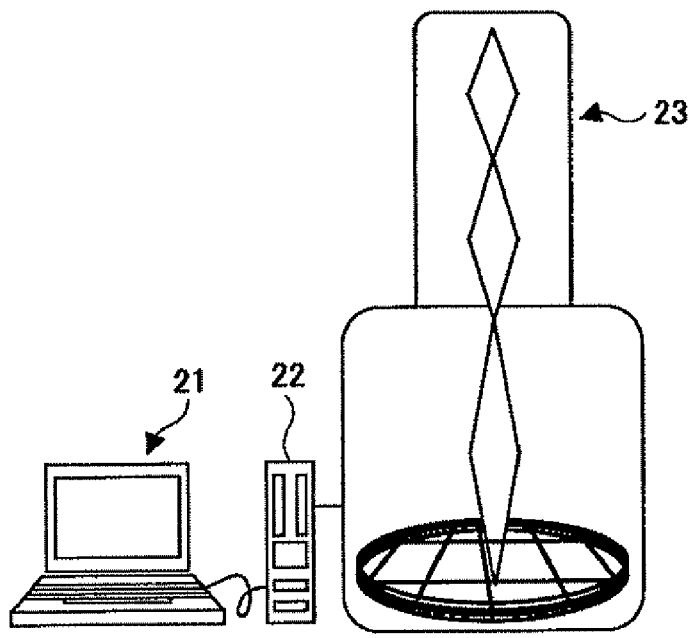
FIG. 6 is a schematic view of an exposure system according to a first embodiment of the present invention.

FIG. 6 is a schematic view of an exposure system according to a first embodiment of the present invention. An exposure system 20 includes a general-purpose computer 21, an interface unit 22, and an electron-beam exposure apparatus 23. Since the computer 21 has a known basic configuration that includes a processor such as a CPU (central processing unit) or MPU (micro processing unit), a storage unit such as a memory, and an input unit such as a keyboard, a description and illustration thereof are omitted. A program executed by and data used by the computer 21 are stored in the storage unit inside the computer 21 and/or a storage unit outside the computer 21. The external storage unit may be connected to the computer 21 through a network, may be provided inside the exposure system 20, or may be provided outside the exposure system 20. The storage unit in which the program is stored may be any computer-readable medium, but is not particularly limited thereto. The electron-beam exposure apparatus 23 has a known basic configuration for deflecting an electron beam that irradiates a wafer placed on a movable wafer stage and for performing exposure to directly write an electron-beam exposure pattern to the wafer, as needed. Although the electron-beam exposure apparatus 23 is used in this case for convenience of description, it goes without saying that any exposure apparatus using a direct writing technology, for example, a laser-beam exposure apparatus, can be used as the exposure apparatus 23.

Figure 7:
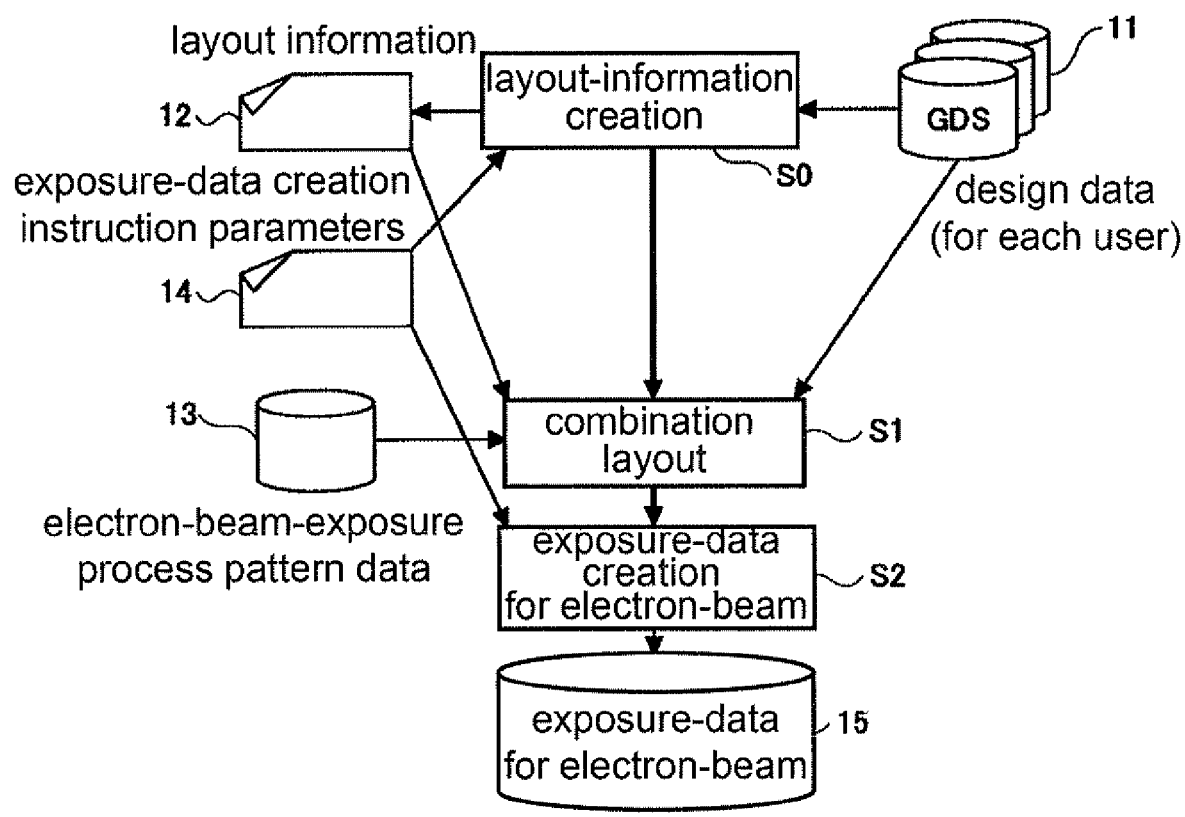
FIG. 7 is a flow diagram illustrating an operation of the exposure system according to the first embodiment.

FIG. 7 is a flow diagram illustrating the operation of the exposure system 20 according to the first embodiment of the present invention. The processor in the computer 21 executes the processing in the flowchart. In the present embodiment, a method for manufacturing a semiconductor device includes at least steps shown in FIG. 7. The program causes the computer 21 to execute at least the processing procedure shown in FIG. 7.

In FIG. 7, in step S0, layout-information creation processing is performed to create design data 11 and layout information (or layout data) 12, The design data 11 is data regarding multi-project-chip semiconductor elements to (hereinafter may be referred to as "semiconductor chips" or "multi-project chips") to be fabricated in a predetermined area on a wafer. The layout information 12 indicates a layout of the semiconductor chips fabricated on the wafer based on exposure-data creation instruction parameters 14. In step S1, combination layout processing is performed to create one-file data (hereinafter referred to as "file data") regarding the semiconductor chips to be fabricated in the predetermined area, by combining the design data 11 and electron-beam-exposure process pattern data 13 on the basis of the layout information 12.

For example, in the case of FIG. 1, the design data 11 varies for each user and contains data on the individual semiconductor chips on a wafer 1. The electron-beam-exposure process pattern data 13 contains data of a pattern, such as a circuit pattern to be exposed, for example, data of a layout of the individual semiconductor chips fabricated on the wafer 1. For example, in the case of FIG. 1, the layout information 12 contains a layout of the semiconductor chips 3. The exposure-data creation instruction parameters 14 include data of the exposure order of the pattern of the semiconductor chips 3 fabricated on the wafer 1. For example, in the case of FIG. 1, the exposure-data creation instruction parameters 14 contain data of the exposure order of the semiconductor chips 3. The data 11, 13, and 14 may be externally input to the computer 21 through a network, may be input via the input unit of the computer 21, or may be pre-stored in the storage unit in the computer 21. For example, in the case of FIG. 1, the file data created in the combination layout processing contains data of the semiconductor chips 3 to be fabricated in an area 2.

In step S2, exposure-data creation processing is performed. Specifically, on the basis of the exposure-data creation instruction parameters 14 that contain the data of the exposure order of the pattern, the file data created in the combination layout processing in step S1 is converted into electron-beam exposure data 15 having a format suitable for exposure processing of the electron-beam exposure apparatus 23. This exposure-data creation processing involves conversion processing and editing processing. In the conversion processing, sizing, partial one-shot exposure graphics extraction, proximity effect correction, rectangle division, rectangular division, format conversion, and so on, which are analogous to those in the known system, are performed on the file data. In the editing processing, the exposure data for the multi-project chips is edited so that optimum exposure patterns are arranged for valid chips and invalid chips, respectively, as described below. The electron-beam exposure data 15 is stored in the storage unit provided inside the exposure system 20 (e.g., inside the computer 21) or provided outside the exposure system 20, and is also input to the electron-beam exposure apparatus 23. The electron-beam exposure apparatus 23 to perform exposure to write an exposure pattern indicated by the input electron-beam exposure data 15 onto the wafer in exposure order according to the exposure-data creation instruction parameters 14. Thereafter, various types of deposition processing are performed by a known method, according to the exposure pattern, and ultimately, a multi-project-chip semiconductor device having multiple project chips on the wafer is fabricated. The multi-project chips fabricated on the wafer may be diced into individual chips.

The layout-information creation processing in step S0 will now be described in detail with reference to FIGS. 8 to 10.

In the layout-information creation processing, first, a chip management table 31 as shown in FIG. 8 is created with respect to the design data 11 for the chips to be provided in the multi-project-chip semiconductor device. The chip management table 31 stores user names (or client names), chip identification numbers, chip sizes or layout area coordinates, manufacture conditions, and the number of shots (the number of electron-beam irradiations). In this example, the manufacture conditions include arbitrary items a to g that require individual actions. With respect to the semiconductor chips in the multi-project-chip semiconductor device, chip identification numbers unique to the respective semiconductor chips are given, chips sizes thereof are determined, and the number of shots used during conversion of the design data 11 into the electron-beam exposure data is determined. For example, information of the number of vertexes or the number of line segments, the number indirectly indicating the number of shots, may be used instead of the number of shots. In the chip management table 31, as the manufacture condition of each piece of chip data, "1" is set and stored in the field of an item that requires an action and default "0" is shown in the field of an item that does not require an action, in addition to the user names, chip identification numbers, chip sizes or layout area coordinates, and the number of shots.

When the storage of information regarding all semiconductor chips in the multi-project-chip semiconductor device into the chip management table 31 is completed as shown in FIG. 8, the contents of the chip management table 31 are sorted row-wise in descending or ascending order by using, for example, seven-digit binaries of the items a to g in the manufacture conditions as a first key and using the number of shots as a second key. FIG. 9 illustrates the chip management table 31 after such sorting is performed. In FIGS. 8 and 9, m and n are positive integers that satisfy n>m. In FIG. 9, "min" indicates a minimum value and "max" indicates a maximum value.

Even the same user may fabricate multiple semiconductor chips having different manufacture conditions in a multi-project-chip semiconductor device. Also, multiple different users may fabricate semiconductor chips having the same manufacture condition in a multi-project-chip semiconductor device. In other words, semiconductor chips having the same manufacture condition fabricated in a multi-project-chip semiconductor device do not necessary belong to the same user.

Although the chip management table 31 shown in FIGS. 8 and 9 stores the user names of the individual semiconductor chips, it goes without saying that it may store information indicating specifications or types of the semiconductor chips instead of the user names.

Next, while considering the chip sizes, the computer 21 determines the layout of the semiconductor chips in the multi-project-chip semiconductor device sequentially from the top row of the chip management table 31 (shown in FIG. 9) sorted by the computer 21, in accordance with the data of the pattern exposure order contained in the exposure-data creation instruction parameters 14. The layout of the semiconductor chips, i.e., the layout area coordinates of the semiconductor chips in the multi-project-chip semiconductor device, instead of the chip sizes, is stored in the chip management table 31, as shown in FIG. 9. The chip management table 31 (shown in FIG. 9) that stores the layout area coordinates of the semiconductor chips is used as the layout information 12.

Figure 10:
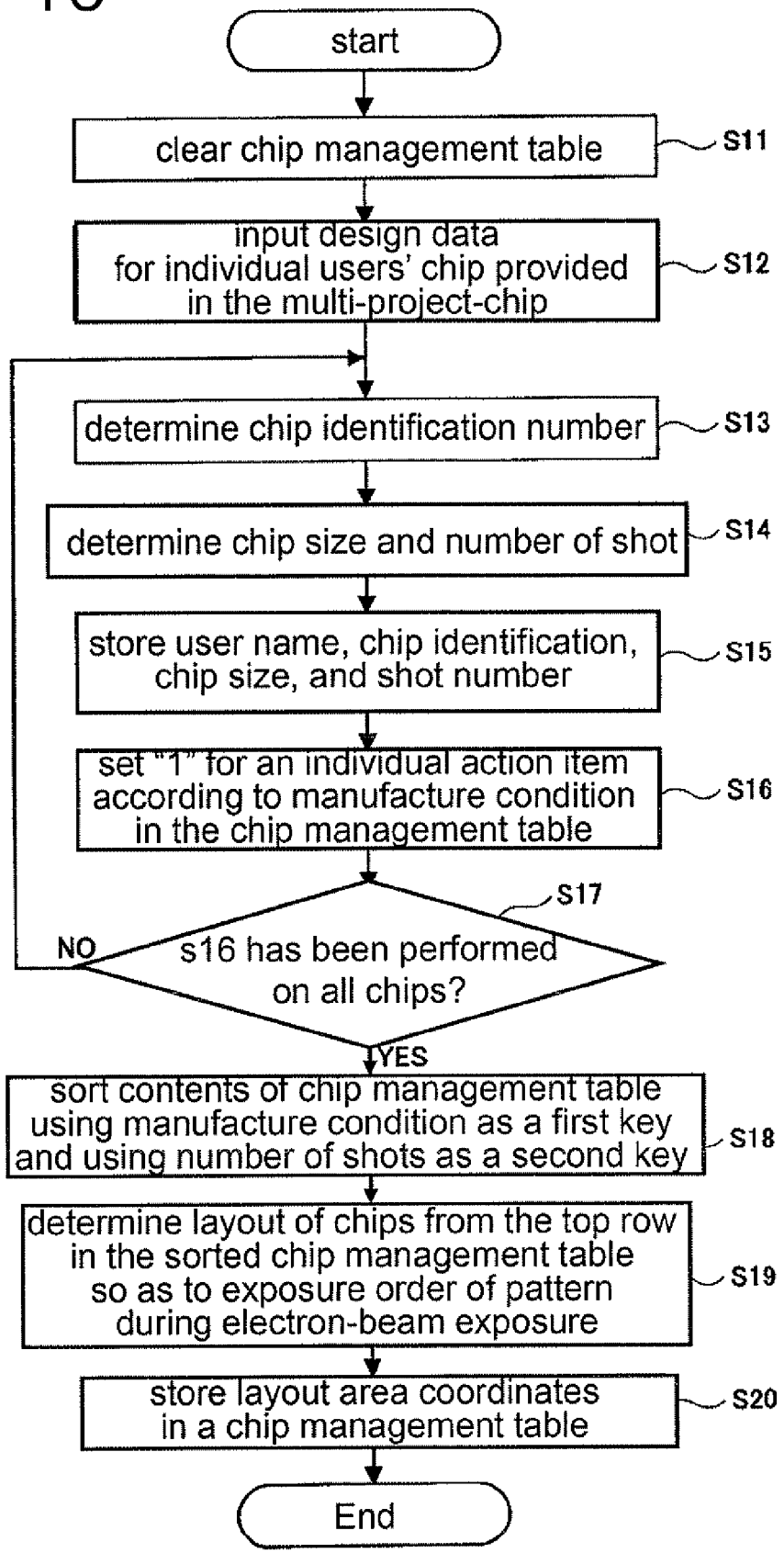
FIG. 10 is a flowchart illustrating layout-information creation processing.

FIG. 10 is a flowchart illustrating layout-information creation processing, which is executed by the processor in the computer 21. In FIG. 10, in step S1, initialization processing is performed to clear the chip management table 31. In step S12, the design data 11 regarding the individual users' semiconductor chips provided in the multi-project-chip semiconductor device to be manufactured. In step S13, the chip identification numbers of the semiconductor chips are determined automatically or based on an instruction input by the operator via the input unit of the computer 21. In step S14, the chip sizes are determined from the design data 11 and the number of shots used during the conversion of the design data 11 into the electron-beam exposure data. In step S15, the user names are stored in the chip management table 31 in conjunction with the chip identification numbers, the chip sizes, and the number of shots which were obtained in steps S13 and S14. In step S16, on the basis of the instruction input by the operator via the input unit of the computer 21, "1" is set for, of the manufacture conditions in the chip management table 31, an item that requires an action and is stored in the chip management table 31. In step S17, a determination is made as to whether or not the processing in steps S13 to S16 has been performed on all semiconductor chips in the multi-process-chip-system semiconductor device. When the determination result is NO, the process returns to step S13.

On the other hand, when the determination result in step S17 is YES, the process proceeds to step S18, in which the contents of the chip management table 31 are sorted row-wise in descending or ascending order by using seven-digit binaries of the items a to g in manufacture conditions, stored in the chip management table 31, as a first key and using the number of shots as a second key. Consequently, the chip management table 31 shown in FIG. 8 turns into the state shown in FIG. 9. In step S19, while considering the chip sizes, the layout of the semiconductor chips in the multi-project-chip semiconductor device is determined sequentially from the top row in the sorted chip-management table 31 shown in FIG. 9 so as to correspond to the exposure order of the pattern during electron-beam exposure. In step S20, the layout of the semiconductor chips in the multi-project-chip semiconductor device, i.e., the layout area coordinates of the semiconductor chips, is stored in the chip management table 31, as shown in FIG. 9, and the process ends. The chip management table 31 (shown in FIG. 9) that stores the layout area coordinates of the semiconductor chips is used as the layout information 12.

FIGS. 11 to 15 illustrate the layout information 12 created in the layout-information creation processing.

Figure 11:
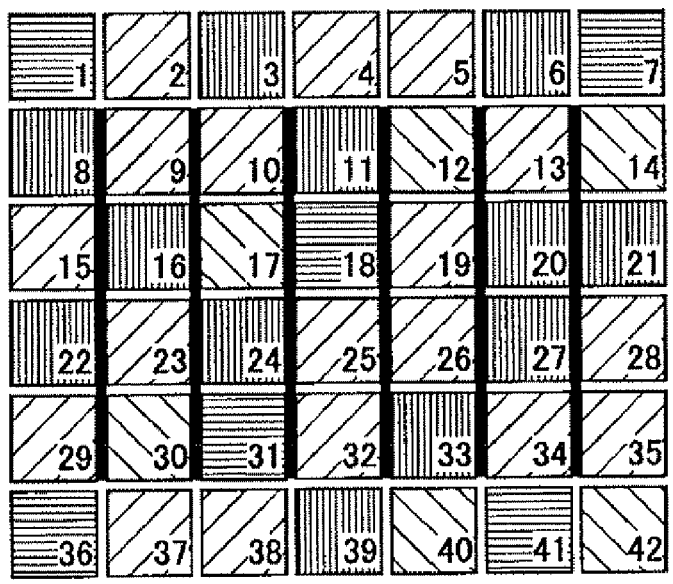
FIG. 11 shows a layout of semiconductor chips to be fabricated in a predetermined area in a multi-project-chip semiconductor device.

FIG. 11 shows a layout of semiconductor chips to be fabricated in a predetermined area in a multi-project-chip semiconductor device, the layout being obtained before the chip management table 31 is sorted. In FIGS. 11, 12, 13, and 15, each rectangle indicates the area of one semiconductor chip, a numeral shown in each rectangle indicates a chip identification number, and the same hatching indicates semiconductor chips fabricated with the same manufacture condition. For convenience of description, it is assumed that the semiconductor chips denoted by the chip identification numbers in FIGS. 11 to 14 are different from the semiconductor chips denoted by the chip identification numbers shown in FIGS. 8 and 9.

Figure 12:
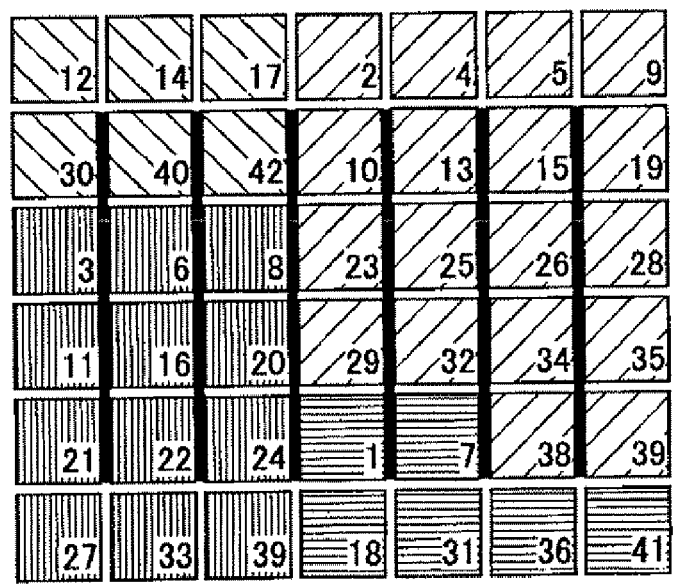
FIG. 12 shows a layout of a case in which semiconductor chips having the same manufacture condition are arranged adjacent to each other.
Figure 13:
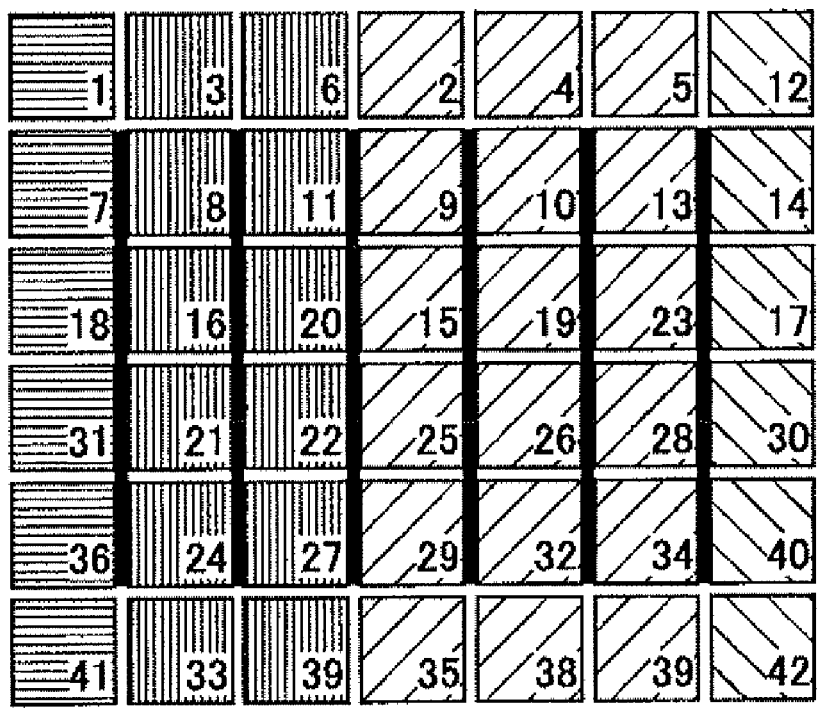
FIG. 13 is a layout of a case in which the semiconductor chips having the same manufacture condition are arranged in the same column in a wafer scan direction.

FIG. 12 shows a layout of semiconductor chips fabricated in a predetermined area in a multi-project-chip semiconductor device. In this layout, of the semiconductor chips shown in FIG. 11, the semiconductor chips having the same manufacture condition are arranged adjacent to each other. FIG. 13 shows a layout of semiconductor chips to be fabricated in the predetermined area in the multi-project-chip semiconductor device. In this layout, of the semiconductor chips shown in FIG. 12, the semiconductor chips having the same manufacture condition are arranged in the same column in a wafer scan direction (i.e., in a direction opposite to a wafer-stage moving direction).

Figure 14A:
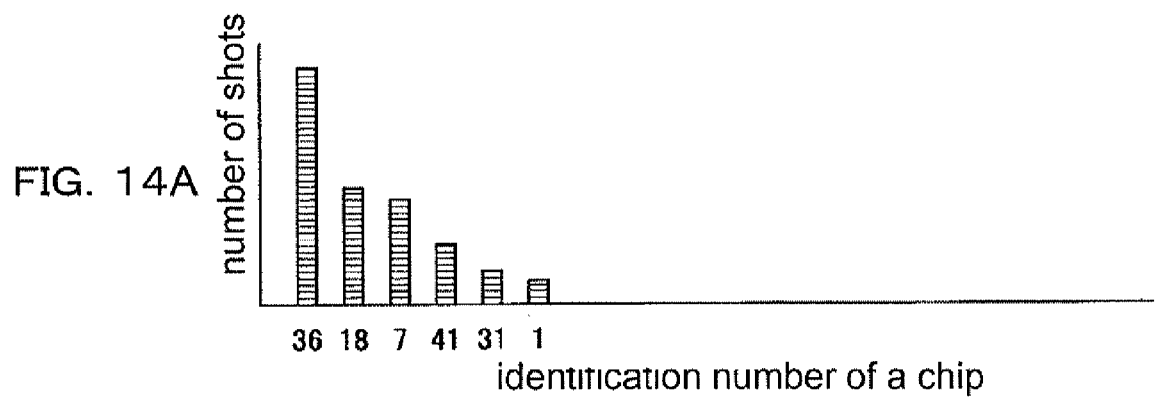
FIGS. 14A to 14D each show the relationship between the chip identification numbers of the semiconductor chips having the same manufacture condition and the number of shots.
Figure 14B:
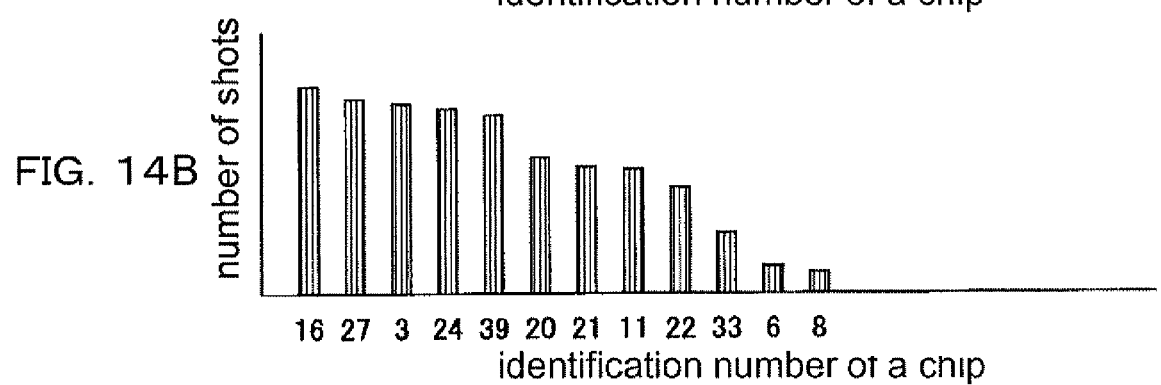
Figure 14C:
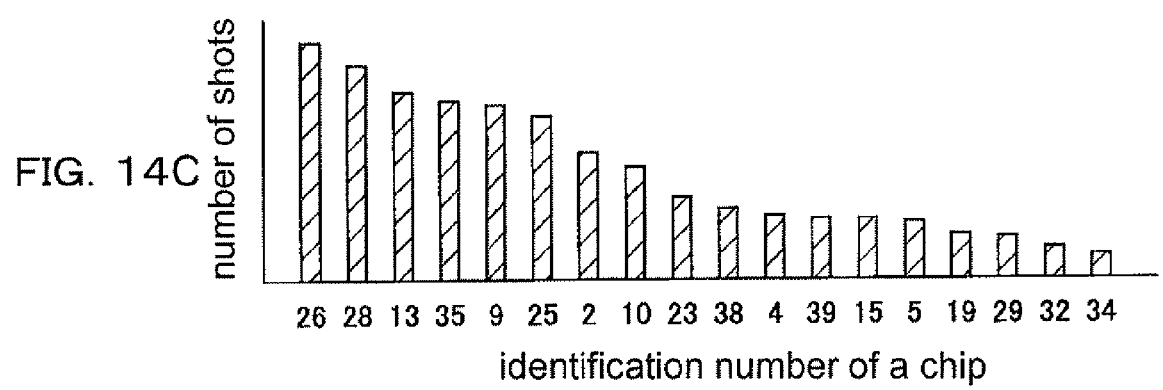
Figure 14D:
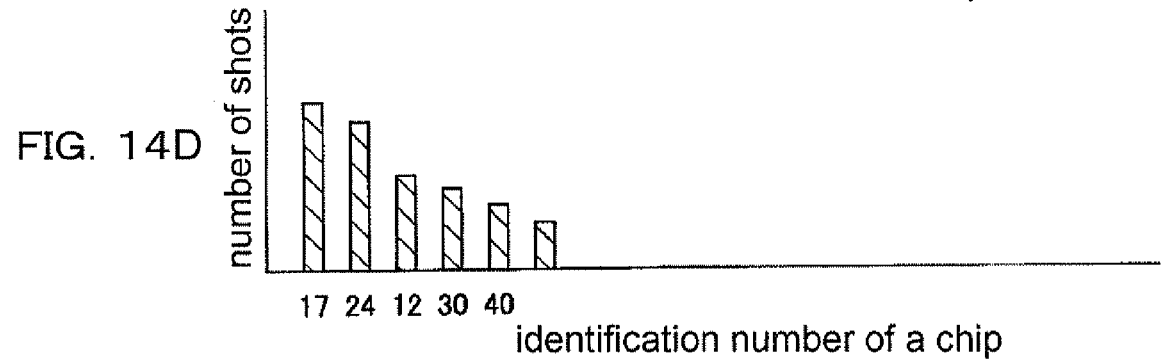

FIGS. 14A to 14D each show relationships between the chip identification numbers of the semiconductor chips having the same manufacture condition and the number of shots. More specifically, FIG. 14A shows the number of shots for semiconductor chips fabricated with a first semiconductor condition, the semiconductor chips having chip identification numbers 1, 7, . . . and so on; FIG. 14B shows the number of shots for semiconductor chips fabricated with a second semiconductor condition, the semiconductor chips having chip identification numbers 3, 6, . . . and so on; FIG. 14C shows the number of shots for semiconductor chips fabricated with a third semiconductor condition, the semiconductor chips having chip identification numbers 2, 4, . . . and so on; and FIG. 14D shows the number of shots for semiconductor chips fabricated with a fourth semiconductor condition, the semiconductor chips having chip identification numbers 12, 14, . . . and so on.

Figure 15:
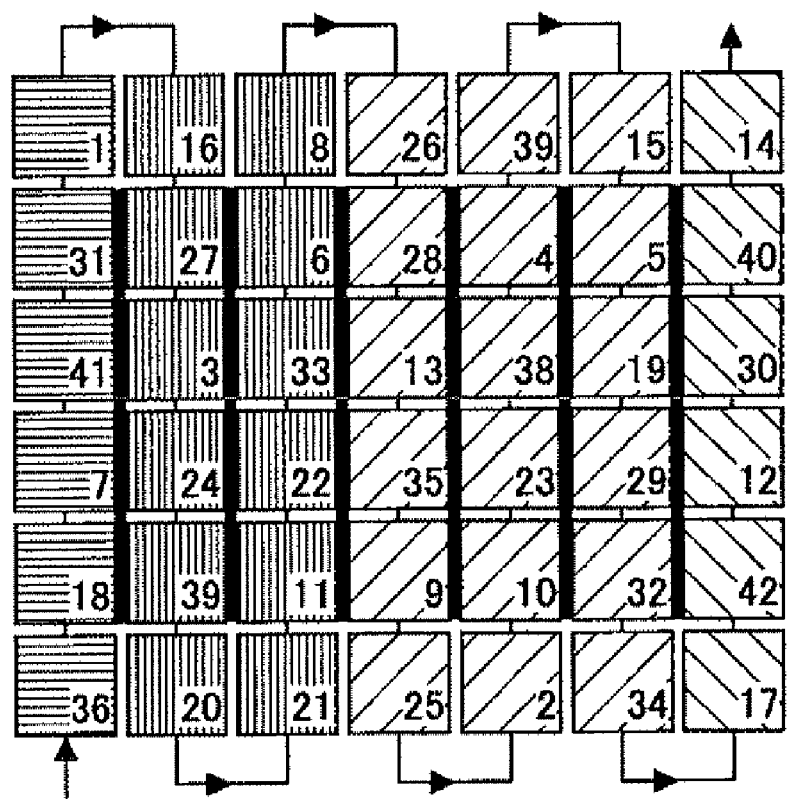
FIG. 15 shows a layout obtained as a result of sorting of the layout shown in FIG. 14 in descending order by using the first to fourth manufacture conditions as a first key and using the number of shots as a second key.

FIG. 15 shows a layout of semiconductor chips to be fabricated in a predetermined area in a multi-project-chip semiconductor device, the layout being obtained as a result of sorting of the layout shown in FIG. 14 in descending order by using the first to fourth manufacture conditions shown in FIG. 14 as a first key and using the number of shots shown in FIG. 14 as a second key. In FIG. 15, arrows indicate the wafer scan direction. As shown in FIG. 15, the layout of the semiconductor chips in the multi-project-chip semiconductor device is determined sequentially from the top row of the sorted chip management table 31 so as to correspond to the data of the pattern exposure order in accordance with the number of shots for the semiconductor chips, while considering the individual chips sizes. Consequently, semiconductor chips having a similar number of shots are arranged in the same column as much as possible in the wafer scan direction. FIG. 15 shows a case in which the semiconductor chips are arranged in descending order of the number of shots.

In the present embodiment, as described above, the semiconductor elements fabricated on the wafer have a layout that corresponds to the exposure order of the pattern of the semiconductor devices and that is based on the information indicating the manufacture conditions and the number of shots and are arranged such that the semiconductor elements having the same manufacture condition are adjacent to each other in descending or ascending order of the number of shots. By using a known direct writing technology using an electron beam, the electron-beam exposure apparatus 23 performs exposure on the semiconductor elements in accordance with the exposure order.

Second Embodiment

Figure 16:
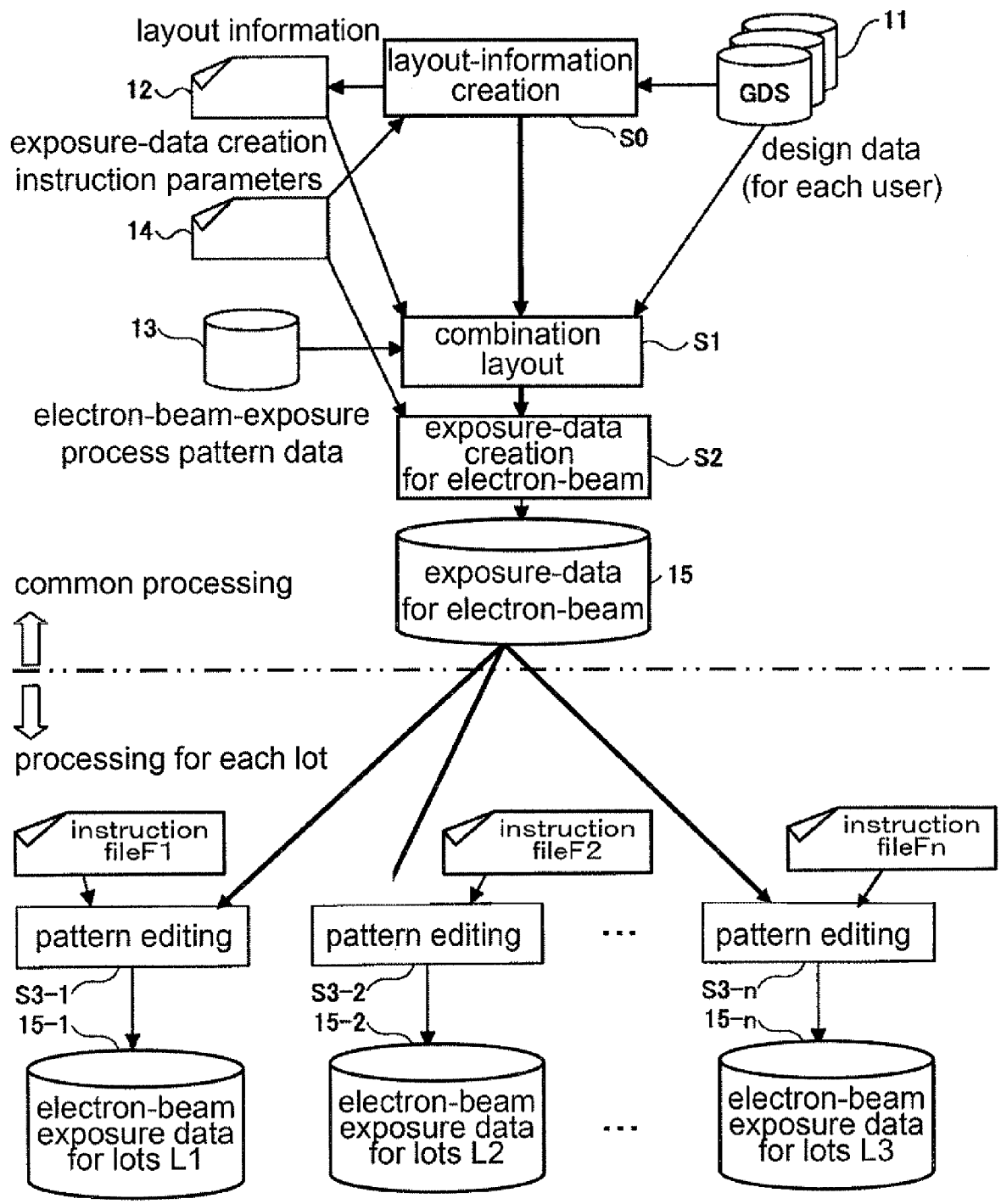
FIG. 16 is a flow diagram illustrating an operation of the exposure system according to a second embodiment of the present invention.

FIG. 16 is a flow diagram illustrating an operation of the exposure system 20 in a second embodiment of the present invention. In FIG. 16, the same portions as those in FIG. 7 are denoted by the same reference numerals, and descriptions thereof are omitted.

In the second embodiment, the electron-beam exposure data 15 is stored for each lot in the storage unit provided inside the exposure system 20 (e.g., inside the computer 21) or provided outside the exposure system 20, and is also input to the electron-beam exposure apparatus 23.

Thus, in step S0, layout information creation processing for creating layout information 12 in which the layout of semiconductor chips in a multi-project-chip semiconductor device is defined so as to correspond to the data of the pattern exposure order contained in the exposure-data creation instruction parameters 14 is performed on one multi-project-chip semiconductor device once. In step S1, on the basis of the design data 11, the layout information 12, and the electron-beam-exposure process pattern data 13, combination layout processing for creating file data is performed on one multi-project-chip semiconductor device. In step S2, on the basis of the file data, exposure-data creation processing for creating electron-beam exposure data for each lot is performed on one multi-project-chip semiconductor device a number of times corresponding to required lots.

Figure 17:
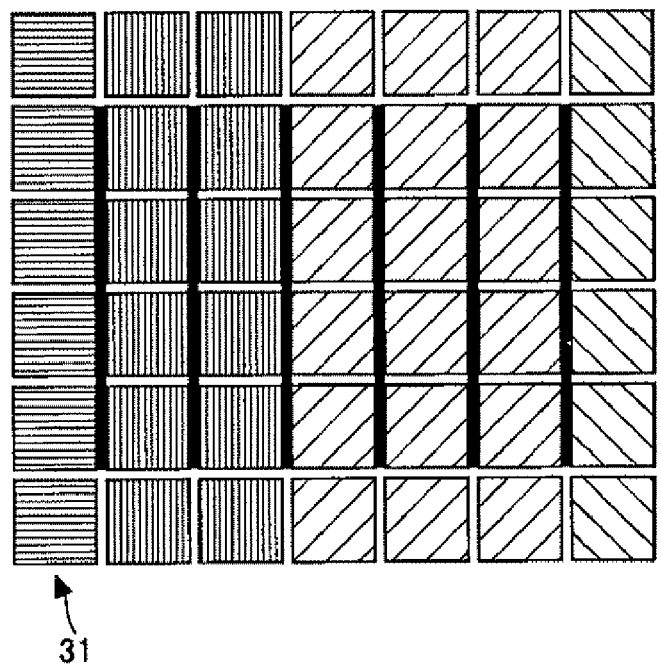
FIG. 17 shows a layout of semiconductor chips to be fabricated in a predetermined area in a multi-project-chip semiconductor device.
Figure 18:
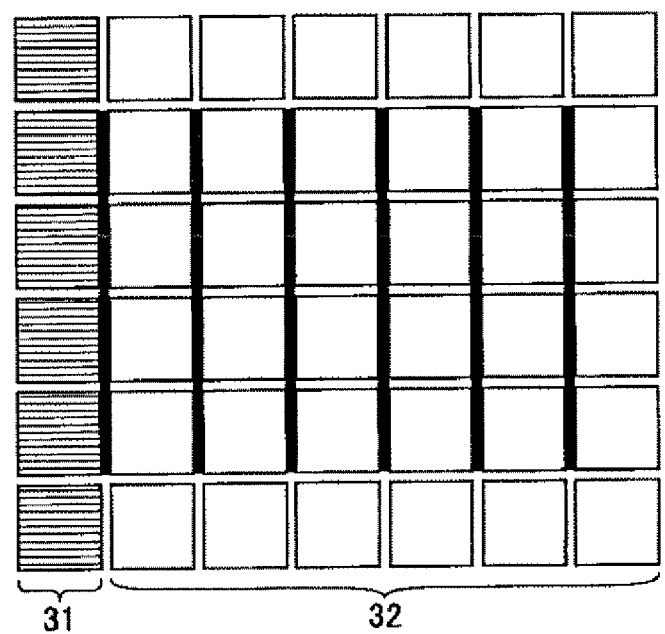
FIG. 18 illustrates deletion of a pattern in an invalid chips area.

More specifically, in steps S3-1 to S3-$n$, on the basis of instruction files F1 to Fn for lots L1 to Ln which are created from the chip management table 31, pattern editing processing for controlling the generation of patterns in specified areas is performed on the electron-beam exposure data 15 for the corresponding lots L1 to Ln. The specified area may be, for example, an arbitrary area input by the operator via the input unit of the computer 21, and is not limited to an invalid-chip area. In the pattern editing processing, the control for the generation of a pattern for the specified area is performed, for example, to delete a pattern for the specified area. Thus, for example, in the layout of the semiconductor chips to be fabricated in the predetermined area in the multi-project-chip semiconductor device shown in FIG. 17, it is possible to generate only a pattern for a valid-chip area 31 while preventing the generation of a pattern for an invalid-chip area 32, as shown in FIG. 18. In FIGS. 17 and 18, the same portions as those in FIG. 15 are denoted by the same reference numerals, and descriptions thereof are omitted. The electron-beam exposure data 15 subjected to the pattern editing processing is stored in the storage unit provided inside the exposure system 20 (e.g., inside the computer 21) or provided outside the exposure system 20, as electron-beam data 15-1 to 15-$n$ for the respective lots L1 to Ln, and is also input to the electron-beam exposure apparatus 23.

For example, as shown below, the instruction file F1 for the lot L1 states layout area coordinates of invalid chips and distances from arrangement areas which identify the invalid chip areas 32 from which the patterns are to be deleted. That is, an area (Xmin, Ymin, Xmax, Ymax) from which the pattern is to be deleted is defined by a rectangular area expressed by absolute coordinates from the origin of an electron-beam shot.

| | |
|---|---|
| X1min, Y1min, X1max, Y1max; 1 | |
| X2min, Y2min, X2max, Y2max; 2 | |
| X3min, Y3min, X3max, Y3max; 3 | |
| 0 | ; deletion position |

For the distance from the arrangement area which identifies the invalid-chip area 32 from which the pattern is to be deleted, a positive or negative value including "0" may be specified. For example, when the distance from the arrangement area which identifies the invalid-chip area 32 from which the pattern is to be deleted is "0", this means that the entire pattern in the invalid chip area 32 is to be deleted.

Figure 19:
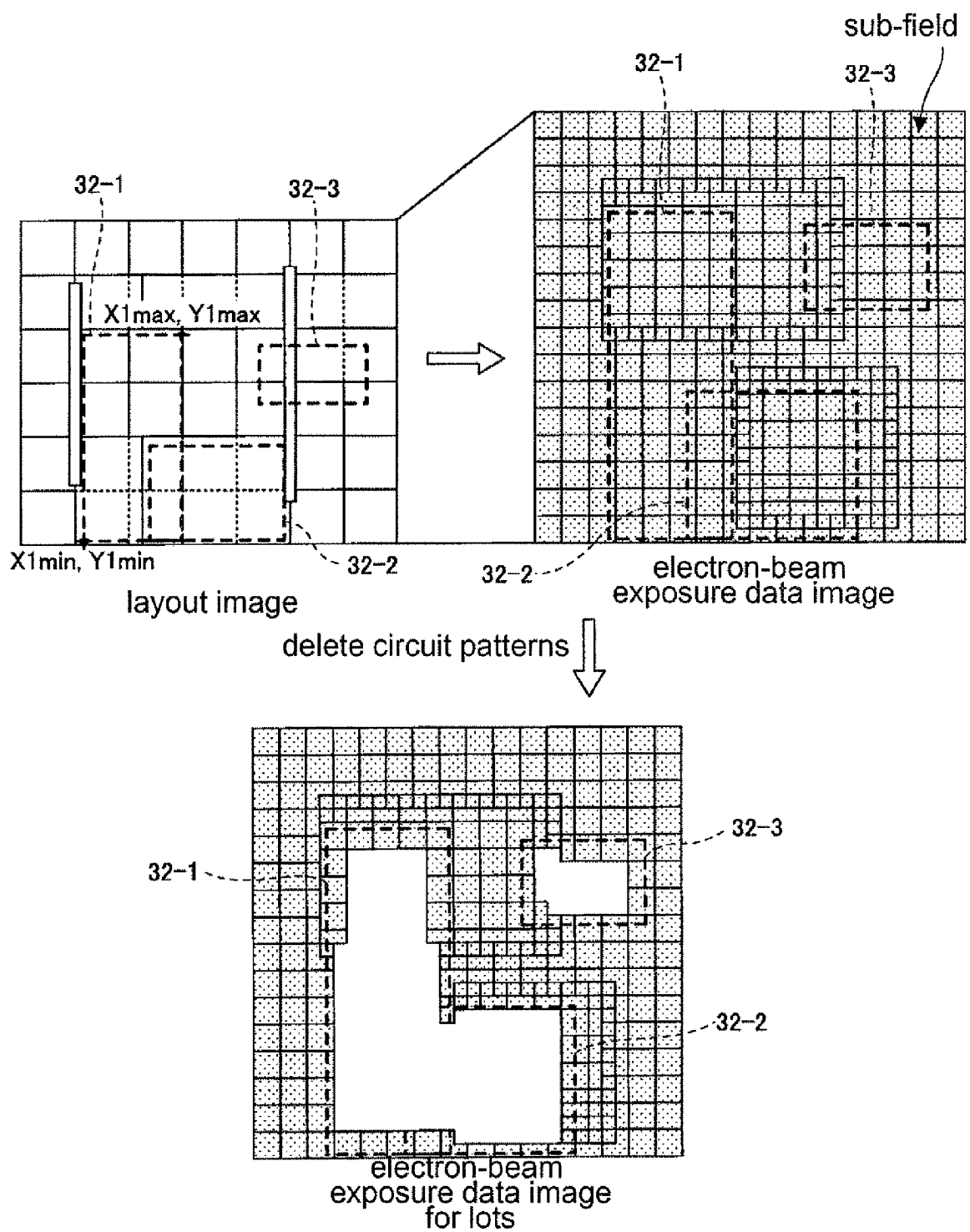
FIG. 19 illustrates pattern deletion performed in pattern editing processing.

The pattern deletion performed in the pattern editing processing, for example, in step S3-1 will be described in conjunction with FIG. 19. Patterns of invalid-chip areas 32-1 to 32-3 in the electron-beam exposure data 15 are to be deleted in accordance with the instruction file F1. In this case, the patterns in fields or sub-fields completely encompassed by the invalid chip areas 32-1 to 32-3 are deleted for each field or for each sub-field. The term "field" refers to an area to be exposed to an electron beam. The term "sub-field" refers to an area to be exposed to an electron beam at once, i.e., an area to be exposed in a single shot. In FIG. 19, the upper left part shows one example of a layout image of a layout indicated by the electron-beam exposure data 15, the upper right part shows a data image of the pattern of the layout, and the lower part shows a data image obtained after patterns in the invalid-chip area 32 are deleted. The white portions in the data image are portions from which the patterns were deleted. Such a scheme can simplify the pattern editing processing and increase the processing speed.

Since patterns in specified areas, such as an invalid chip area, are deleted, i.e., are not generated, the present embodiment is particularly effective when it is applied to patterns, such as hole layers having openings.

Third Embodiment

Figure 20:
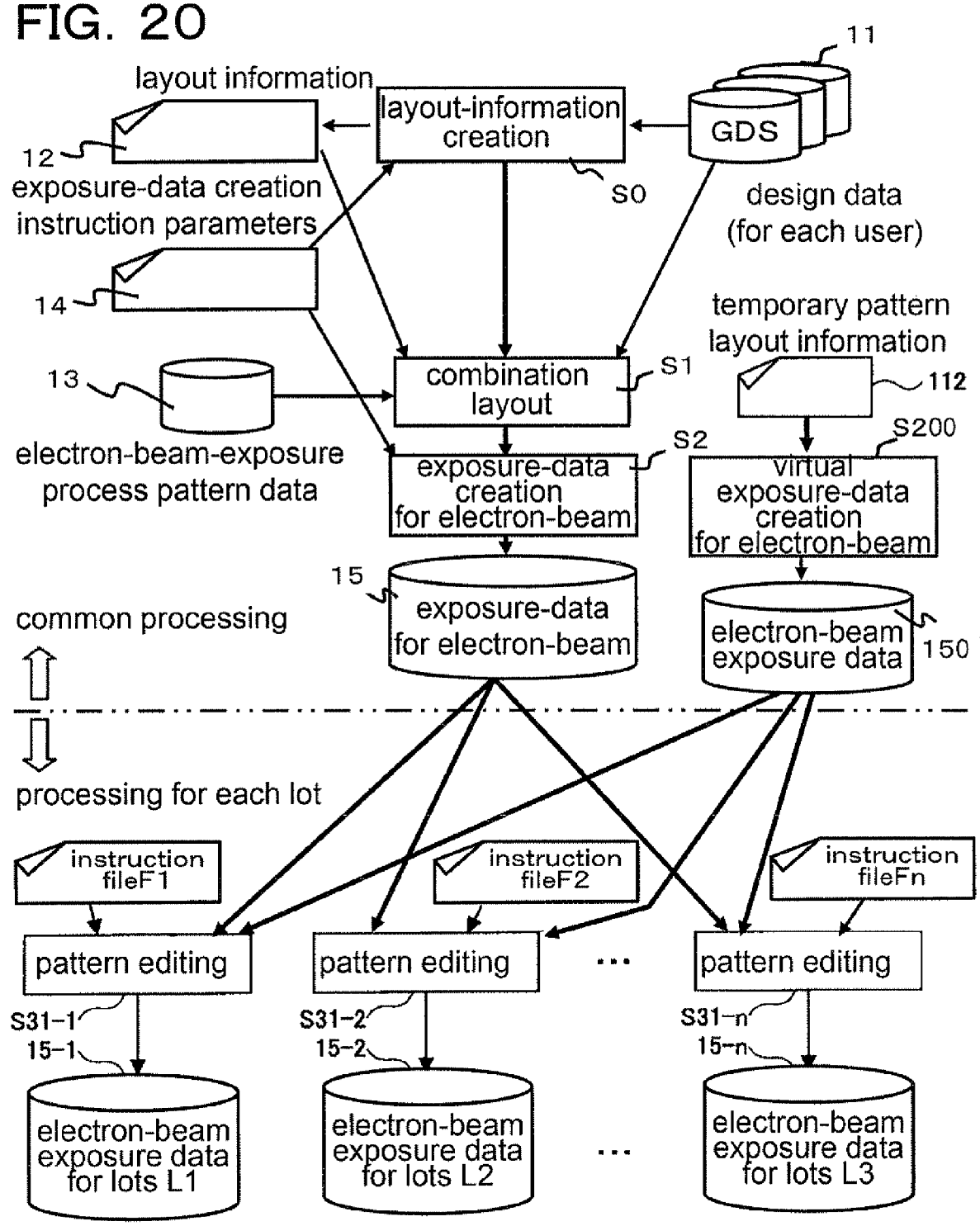
FIG. 20 is a flow diagram illustrating an operation of the exposure system according to a third embodiment of the present invention.

FIG. 20 is a flow diagram illustrating an operation of the exposure system 20 according to a third embodiment of the present invention. In FIG. 20, the same portions as those in FIG. 16 are denoted by the same reference numerals, and descriptions thereof are omitted.

Figure 21:
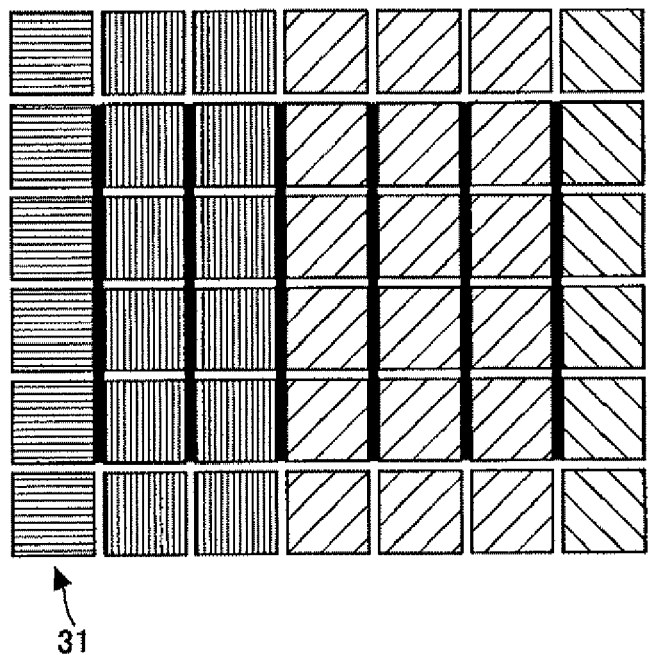
FIG. 21 shows a layout of semiconductor chips to be fabricated in a predetermined area in a multi-project-chip semiconductor device.
Figure 22:
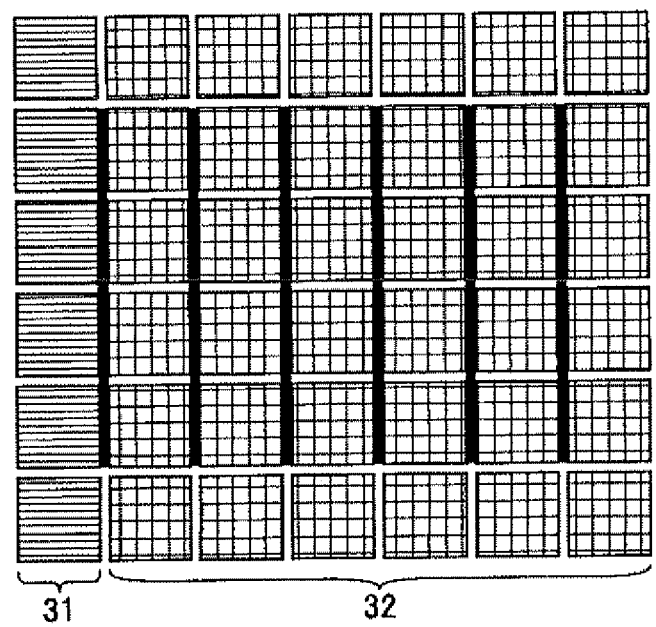
FIG. 22 illustrates replacement of the pattern of an invalid chip area with a virtual pattern.

In the present embodiment, in step S31-1 to S31-n, on the basis of the instruction files F1 to F2 for the lots L1 to Ln which were created from the chip management table 31, pattern editing processing for controlling the generation of patterns in specified areas is performed on the electron-beam exposure data 15 for the corresponding lots L1 to Ln. The specified area may be, for example, an arbitrary area input by the operator via the input unit of the computer 21, and is not limited to an invalid-chip area. In the pattern editing processing, the control for the generation of a pattern in the specified area is performed, for example, to replace the pattern of the specified area with a virtual pattern. The term "virtual pattern" refers to a dummy pattern that is provided at a portion (e.g., in a metal layer or the like) where the operations of elements are not affected and that is intended to maintain the area density of the pattern for flatness. A required minimum number of virtual patterns, each having a required minimum size, are arranged in required minimum areas in the entire or part of specified areas from which the patterns were deleted, in order to appropriately manufacture valid chips. Consequently, for example, in the layout of the semiconductor chips to be fabricated in the predetermined area in the multi-project-chip semiconductor device shown in FIG. 21, only a pattern for the valid-chip area 31 is generated and the pattern in an invalid chip area 32 is replaced with a virtual pattern, as shown in FIG. 22. In FIGS. 21 and 22, the same portions as those in FIGS. 17 and 18 are denoted by the same reference numerals, and descriptions thereof are omitted. The electron-beam exposure data 15 subjected to the pattern editing processing is stored in the storage unit provided inside the exposure system 20 (e.g., inside the computer 21) or provided outside the exposure system 20, as electron-beam data 15-1 to 15-n for the respective lots L1 to Ln, and is also input to the electron-beam exposure apparatus 23.

Figure 23:
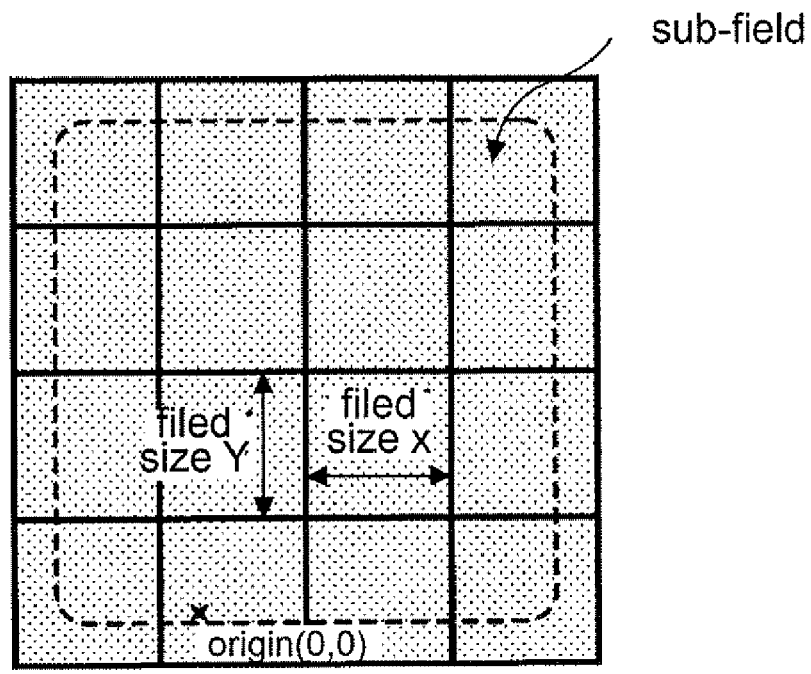
FIG. 23 shows fields in electron-beam exposure data.
Figure 24:
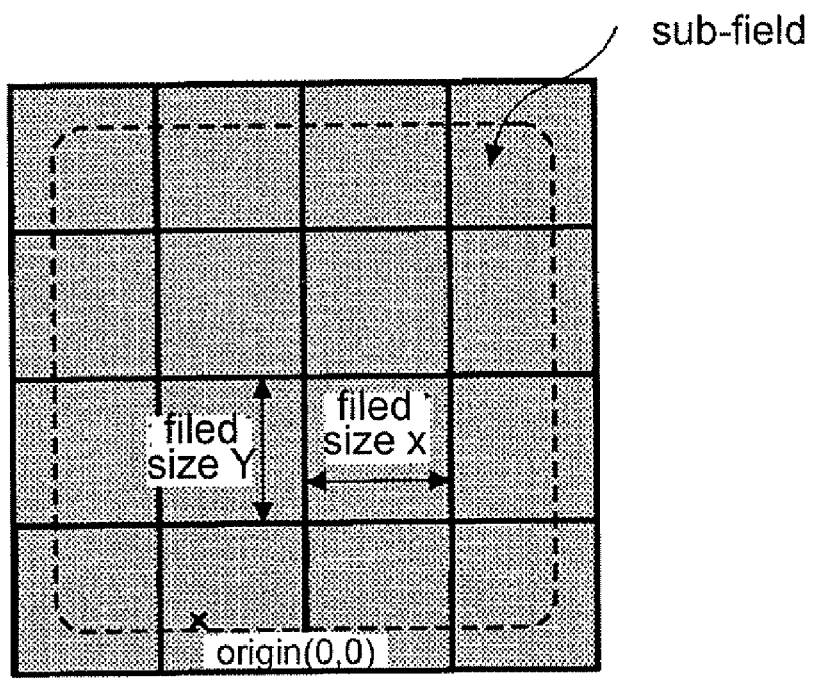
FIG. 24 shows fields in virtual electron-beam exposure data.
Figure 25:
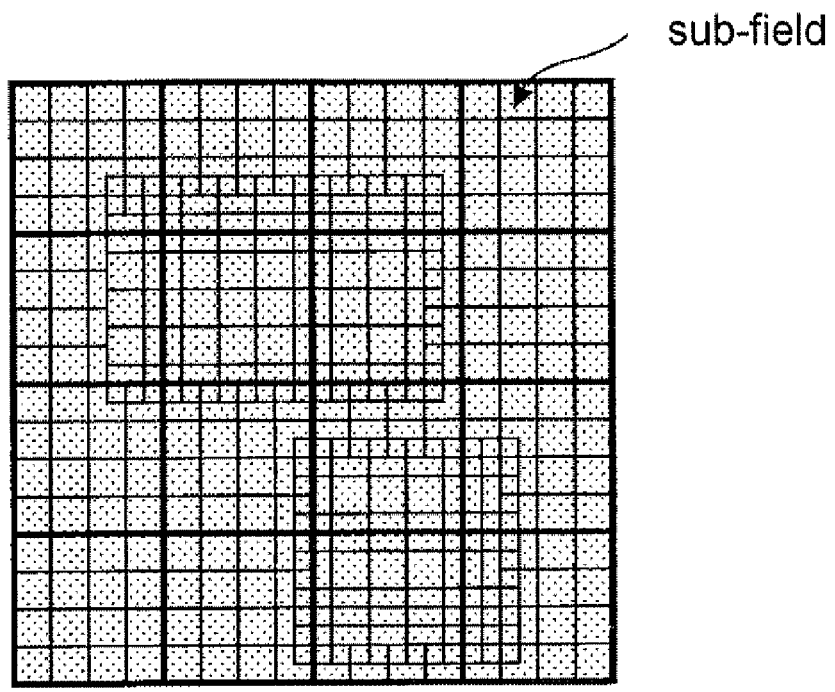
FIG. 25 shows sub-fields in the electron-beam exposure data.
Figure 26:
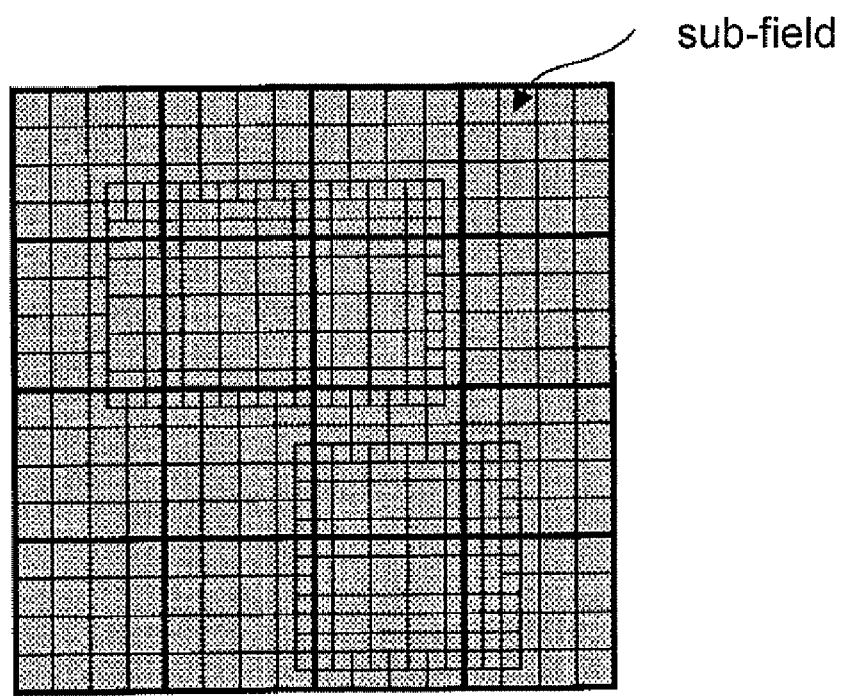
FIG. 26 shows sub-fields in the virtual electron-beam exposure data.

More specifically, in step S200, virtual electron-beam exposure-data creation processing for creating virtual electron-beam exposure data 150 for a layer that requires virtual electron-beam exposure is performed on the basis of virtual-pattern layout information 112 containing semiconductor-chip sizes and virtual-pattern generation conditions. The virtual electron-beam exposure data 150 is stored in the storage unit provided inside the exposure system 20 (e.g., inside the computer 21) or provided outside the exposure system 20. Consequently, the virtual electron-beam exposure data 150 for arranging a virtual pattern on the entire surface of the wafer is created in accordance with the temporary-pattern layout information 112. The temporary-pattern layout information 112 may be externally input to the computer 21 through a network, may be input via the input unit of the computer 21, or may be stored in the storage unit inside the computer 21. The sizes and the layout of the fields and sub-fields in the virtual electron-beam exposure data 150 are made to match those in the electron-beam exposure data 15, as shown in FIGS. 23 to 26. FIG. 23 shows fields in the electron-beam exposure data 15 and FIG. 24 shows fields in the virtual electron-beam exposure data 150. FIG. 25 shows sub-fields in the electron-beam exposure data 15 and FIG. 26 shows sub-fields in the virtual electron-beam exposure data 150.

Replacement of patterns with virtual patterns, the replacement being performed in the pattern editing processing, for example, in step S31-1, will be described in conjunction with FIGS. 27 and 28. FIG. 27 illustrates pattern deletion performed in the pattern editing processing. FIG. 28 illustrates replacement of patterns with virtual patterns, the replacement being performed in the pattern editing processing. Of the electron-beam exposure data 15, patterns in invalid-chip areas 32-1 to 32-3 having patterns to be replaced are deleted in accordance with the instruction file F1. In this case, the patterns in fields or sub-fields completely encompassed by the invalid chip areas 32-1 to 32-3 are deleted for each field or for each sub-field. In FIG. 27, the upper part shows a data image of a layout pattern indicated by the electron-beam exposure data 15, and the lower part shows a data image obtained after patterns in the invalid-chip area 32 are deleted. The white portions in the data image are portions from which the patterns were deleted. In accordance with the instruction file F1, virtual patterns P1 to P3 indicated by the virtual electron-beam exposure data 150 are added to the invalid-chip areas 32-1 to 32-3 from which the pattern were deleted, so that the deleted patterns are replaced with the virtual patterns P1 to P3. In FIG. 28, the upper part shows a data image of a layout pattern indicated by the virtual electron-beam exposure data 150, and the lower part shows a data image obtained after the virtual patterns are added in place of the patterns deleted from the invalid-chip area 32. Although a case in which a virtual pattern is provided in entire specified areas from which the patterns were deleted is illustrated in FIG. 28, the virtual pattern may be partially arranged. Deleting patterns in the field or subfields, completely encompassed by a specified area (e.g., an invalid chip area 32), for each field or for each sub-field and adding virtual patterns in place thereof makes it possible to simplify the pattern editing processing and also makes it possible to increase the processing speed.

In the present embodiment, since the patterns in the specified area, such as an invalid-chip area, is deleted and virtual patterns are added in place of the deleted patterns. Thus, present embodiment is particularly effective when it is applied to patterns, such as metal layers.

Fourth Embodiment

Figure 29:
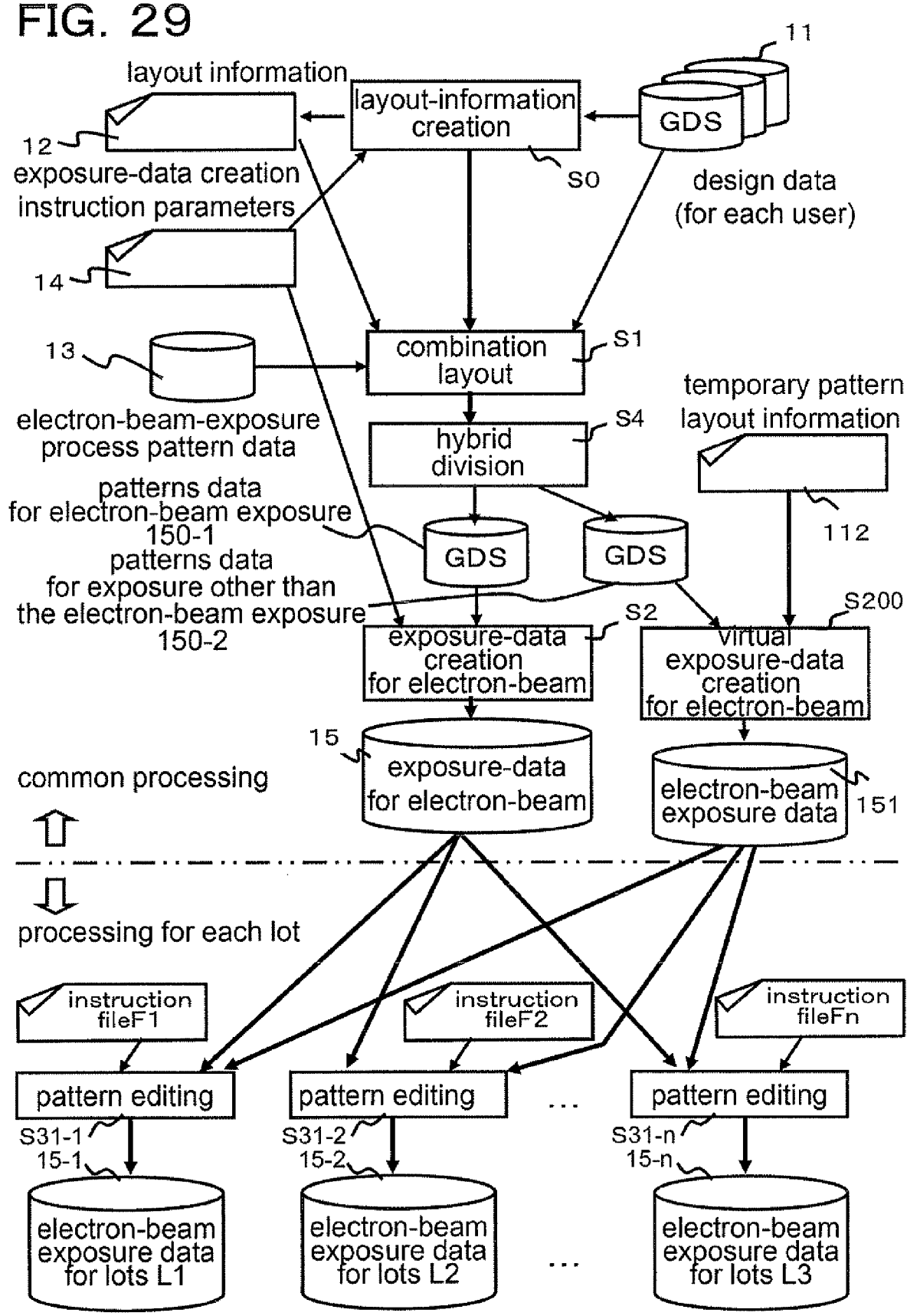
FIG. 29 is a flow diagram illustrating an operation of the exposure system according to a fourth embodiment of the present invention.

FIG. 29 is a flow diagram illustrating an operation of the exposure system 20 according to a fourth embodiment of the present invention. In FIG. 29, the same portions as those in FIG. 20 are denoted by the same reference numerals, and descriptions thereof are omitted.

The fourth embodiment is applied to a case in which the so-called "hybrid exposure" is performed. In the hybrid exposure, electron-beam exposure is performed on one portion (e.g., one layer) on a wafer and exposure that is different from the electron-beam exposure is performed on another portion (e.g., a layer that is different from the aforementioned layer) on the wafer. The exposure that is different from the electron-beam exposure refers to exposure, such as photolithography, which performs exposure through one-shot transfer using a reticle.

In FIG. 29, in step S4, hybrid division processing is performed to divide the file data into pattern data 150-1 for electron-beam exposure and pattern data 150-2 for exposure other than the electron-beam exposure. The pattern data 150-1 and 150-2 for the exposures are stored in the storage unit provided inside the exposure system 20 (e.g., inside the computer 21) or provided outside the exposure system 20. In step S2, processing that is analogous to that in the above-described third embodiment is performed on the pattern data 150-1 for the electron-beam exposure. In step S200, processing that is analogous to that in the above-described third embodiment is performed on the pattern data 150-2 for the exposure other than the electron-beam exposure.

More specifically, in step S2, electron-beam exposure-data creation processing is performed on the pattern data 150-1 for the electron-beam exposure. In step S200, virtual electron-beam exposure-data creation processing for creating virtual electron-beam exposure data 151 for a layer that requires virtual electron-beam exposure is performed based on the pattern data 150-2 and the temporary-pattern layout information 112 containing the semiconductor-chip sizes and virtual-pattern generation conditions. The virtual electron-beam exposure data 151 is stored in the storage unit provided inside the exposure system 20 (e.g., inside the computer 21) or provided outside the exposure system 20. Consequently, the virtual electron-beam exposure data 151 for arranging a virtual pattern on the entire surface of the wafer is created in accordance with the virtual-pattern layout information 112. The temporary-pattern layout information 112 may be externally input to the computer 21 through a network, may be input via the input unit of the computer 21, or may be stored in the storage unit in the computer 21. The sizes and the layout of fields or sub-fields in the virtual electron-beam exposure data 151 are made to match those in the electron-beam exposure data 15.

Figure 30:
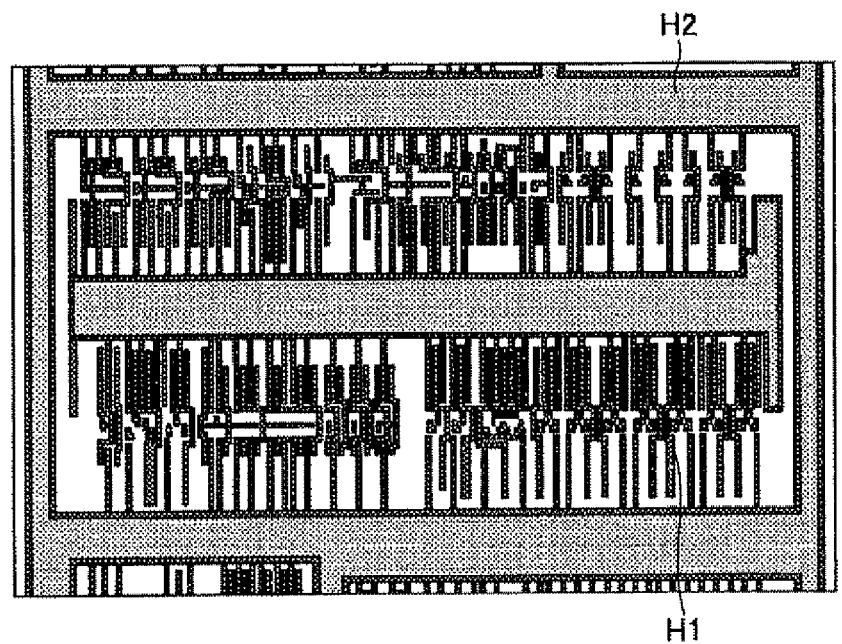
FIG. 30 shows one example of an exposure pattern indicated by exposure data for hybrid exposure.
Figure 31:
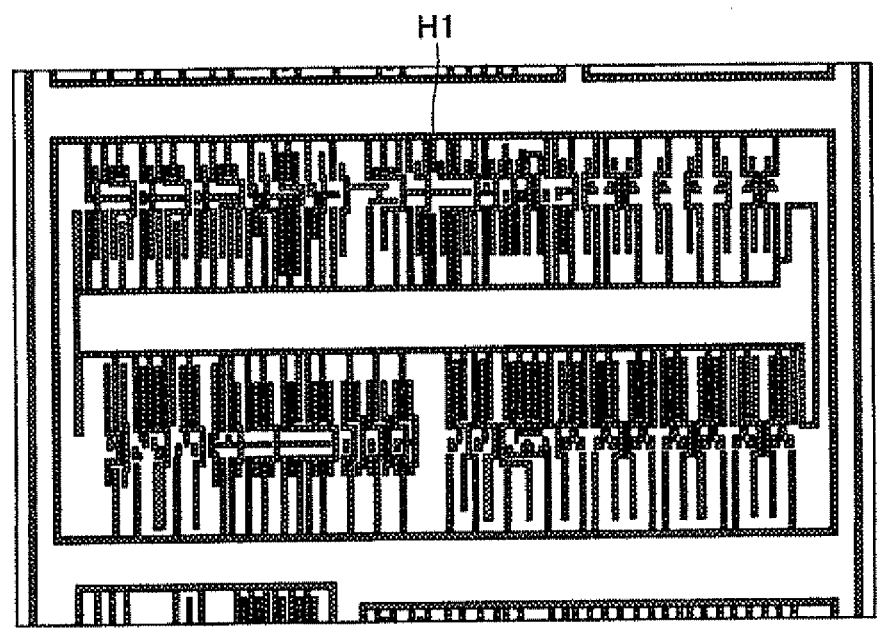
FIG. 31 shows one example of an exposure pattern indicated by electron-beam exposure data obtained by hybrid division processing.
Figure 32:
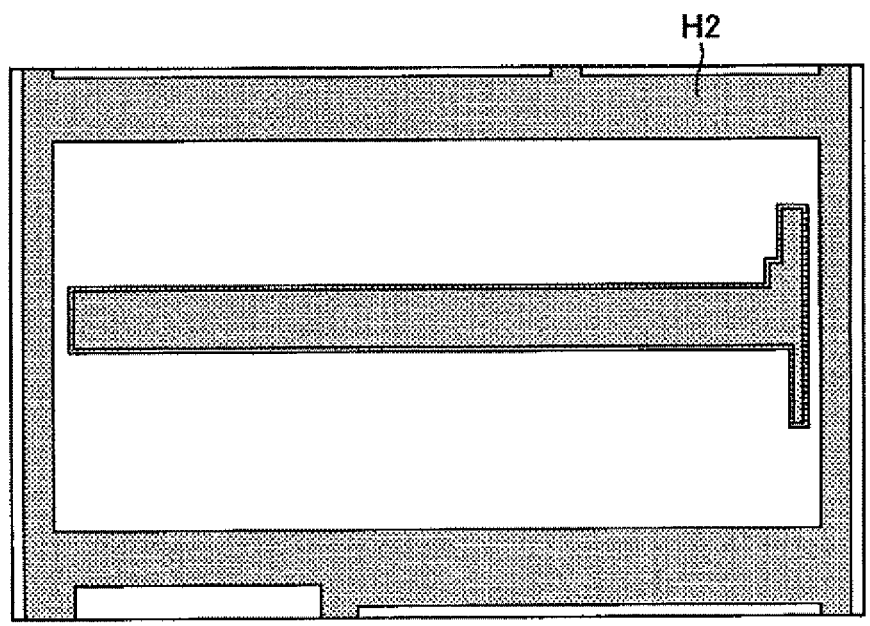
FIG. 32 shows one example of an exposure pattern indicated by pattern data for exposure other than electron-beam exposure, the pattern data obtained by the hybrid division processing.
Figure 33:
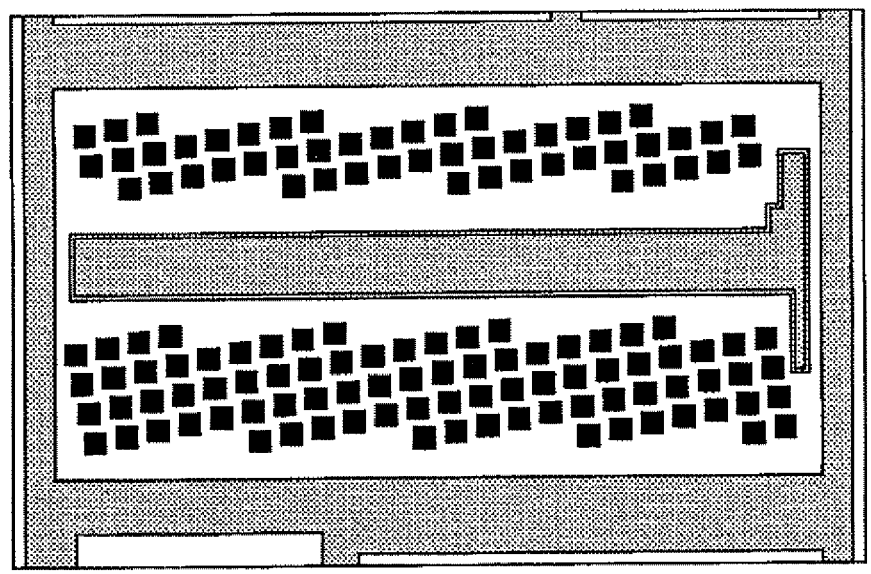
FIG. 33 shows a pattern obtained when a virtual pattern is provided at a specified portion in the exposure pattern shown in FIG. 32, no electron-beam exposure data existing in the specified portion.

The replacement of a pattern with a virtual pattern, the replacement being performed in, for example, the pattern editing processing, for example, in step S31-1, will be described in conjunction with FIGS. 30 to 33. FIG. 30 shows one example of an exposure pattern indicated by exposure data for hybrid exposure, H1 indicating an electron-beam exposure pattern and H2 indicating an exposure pattern obtained by exposure other than the electron-beam exposure. FIG. 31 shows one example of an exposure pattern indicated by the electron-beam exposure data 150-1 obtained by the hybrid division processing in step S4. FIG. 32 shows one example of an exposure pattern indicated by the pattern data 150-2 for the exposure other than the electron beam exposure, the pattern data 150-2 being obtained by the hybrid division processing. FIG. 33 shows a pattern obtained when a virtual pattern is provided at a specified portion where no electron-beam exposure pattern exists in the exposure pattern shown in FIG. 32. Such replacement of the pattern in the specified area (i.e., the invalid area) in the exposure pattern shown in FIG. 32 with the virtual pattern can provide the exposure pattern shown in FIG. 33. Thus, even for a layer to be subjected to hybrid exposure, the virtual pattern exists in the electron-beam exposure data 151 so as to avoid the pattern to be subjected to exposure other than the electron-beam exposure. Thus, in the pattern editing processing, it is possible to perform processing in the same manner for a layer that is not subjected to hybrid exposure, without recognizing a pattern to be subjected to exposure other than electron beam exposure.

Since a pattern in a specified area, such as an invalid-chip area, is deleted and a virtual pattern is added to the area, the present invention is particularly effective when it is applied to a pattern for layer or the like to be subjected to hybrid exposure.

Since resources used in the known exposure-data creation processing are utilized to create the electron-beam exposure data for each lot in the above-described second, third, and fourth embodiments, it is possible to create the electron-beam exposure data that allows for an improvement in the exposure throughput. In addition, the electron-beam exposure data for each lot can be created by simple operations, such as deletion and replacement of patterns in a specified area defined for each lot, through the use of the electron-beam exposure data. Thus, it is possible to execute the electron-beam exposure-data creation processing for each lot in a relatively small amount of calculation time and it is also possible to perform the electron-beam exposure-data creation processing with a relatively small amount of resources.

For example, for creation of electron-beam exposure data for a typical multi-project-chip semiconductor device employing 65 nm technology nodes, an average processing time for one layer of a single lot is 10 seconds and the amount of space used in the storage unit in a computer is 8 M bytes. In contrast, a result of experiment conducted by the present inventors demonstrated that an exposure throughput when the first to fourth embodiments are employed improves by a factor of two on average for one layer of a single lot. Thus, according to each embodiment of the present invention, it is possible to reduce the amount of load on the electron-beam exposure-data creation processing and it is also possible to improve the exposure throughput, compared to the conventional technologies.

Although the present invention has been described above in conjunction with the particular embodiments, the present invention is not limited thereto. Needless to say, various modifications and improvements can be made without departing from the spirit and scope of the present invention.

What is claimed is:

1. A method for manufacturing a multi-project-chip semiconductor device having a plurality of semiconductor chips, the method comprising:
   estimating a number of shots of an electron beam for manufacturing a pattern of each of the plurality of semiconductor chips by using a computer;
   arranging a plurality of semiconductor chips to be fabricated in a multi-project-chip semiconductor device such that the semiconductor chips having the same manufacture condition are adjacent to each other in ascending or descending order of a number of shots, by determining a layout of the plurality of semiconductor chips in accordance with an exposure order set in an exposure apparatus and on the basis of information indicating manufacture conditions and the number of shots; and
   performing exposure, using the exposure apparatus using a direct writing technology, on the plurality of semiconductor chips in accordance with the exposure order.

2. The method according to claim 1, further comprising:
   deleting a pattern for the semiconductor chips in an invalid area on the wafer.

3. The method according to claim 1, further comprising:
   replacing a pattern for the semiconductor chips with a virtual pattern in an invalid area on the wafer.

4. The method according to claim 2, wherein the invalid area is arbitrarily set based on an input to the computer.

5. The method according to claim 2, wherein the invalid area is set based on exposure data for exposure other than for the direct writing technology.

6. The method according to claim 1, wherein the layout of the plurality of semiconductor chips is determined considering sizes of the semiconductor chips.

7. The method according to claim 1, wherein the layout of the plurality of semiconductor chips is determined, using the computer, by:

sorting contents of a management table in descending or ascending order by using manufacture conditions as a first key and using the number of shots as a second key, wherein user names, identification numbers of the semiconductor chips, sizes or layout area coordinates of the semiconductor chips, the manufacture conditions, and the number of shots are stored in the management table; and determining an order of the contents of the management table after the sorting in accordance with the exposure order of the pattern, while considering the sizes of the semiconductor chips.

8. A multi-project-chip semiconductor device, comprising: a plurality of semiconductor chips fabricated on a wafer, wherein the semiconductor chips have a layout that corresponds to an exposure order of a pattern of the plurality of semiconductor chips and that is based on information indicating manufacture conditions and the number of shots of an electron beam to manufacture a pattern of each of the plurality of semiconductor chips by using a computer and are arranged such that the semiconductor chips having the same manufacture condition are adjacent to each other in ascending or descending order of the number of shots.

9. The semiconductor device according to claim 8, wherein, in an invalid area on the wafer, a pattern for the semiconductor chips is deleted.

10. The semiconductor device according to claim 8, wherein, in an invalid area on the wafer, a pattern for the semiconductor chips is deleted and replaced with a virtual pattern.

11. The semiconductor device according to claim 8, wherein the layout of the plurality of semiconductor chips is determined considering sizes of the semiconductor chips.

12. A computer-readable medium that stores a program for causing a computer to perform, in an exposure system including the computer and an exposure apparatus using a direct writing technology, a method for manufacturing of a multi-project-chip semiconductor device having a plurality of semiconductor chips, the method comprising:

estimating a number of shots of an electron beam to manufacture a pattern of each of the plurality of semiconductor chips by using a computer;

arranging a plurality of semiconductor chips to be fabricated such that the semiconductor chips having the same manufacture condition are adjacent to each other in ascending or descending order of a number of shots, by determining a layout of the plurality of semiconductor chips in accordance with an exposure order set in an exposure apparatus and on the basis of information indicating manufacture conditions and the number of shots; and performing exposure, using the exposure apparatus, on the plurality of semiconductor chips in accordance with the exposure order.

13. The computer-readable medium according to claim 12, the method further comprising:

deleting a pattern for the semiconductor chips in an invalid area on the wafer.

14. The computer-readable medium according to claim 12, the method further comprising:

deleting a pattern for the semiconductor chips in an invalid area on the wafer and replacing the pattern with a virtual pattern.

15. The computer-readable medium according to claim 13, the method further comprising:

setting arbitrarily the invalid area on the basis of an input to the computer.

16. The computer-readable medium according to claim 13, the method further comprising:

setting the invalid area on the basis of exposure data for exposure other than for the direct writing technology.

17. The computer-readable medium according to claim 12, the method further comprising:

determining the layout of the plurality of semiconductor chips, considering sizes of the semiconductor chips.

18. The computer-readable medium according to claim 12, wherein the arranging the plurality of semiconductor chips comprises:

sorting of contents of a management table in descending or ascending order by using manufacture conditions as a first key and using the number of shots as a second key, wherein user names, identification numbers of the semiconductor chips, sizes or layout area coordinates of the semiconductor chips, the manufacture conditions, and the number of shots are stored in the management table; and determination of an order of the contents of the management table after the sorting in accordance with the exposure order of the pattern, while considering the sizes of the semiconductor chips.

* * * * *